United States Patent [19]

Peet, Jr. et al.

[11] Patent Number: 5,146,589
[45] Date of Patent: Sep. 8, 1992

[54] REFRESH CONTROL FOR DYNAMIC MEMORY IN MULTIPLE PROCESSOR SYSTEM

[75] Inventors: Charles E. Peet, Jr.; John D. Allison; Kenneth C. Debacker, all of Austin,, Tex.; Robert W. Horst, Champaign, Ill.

[73] Assignee: Tandem Computers Incorporated, Cupertino, Calif.

[21] Appl. No.: 629,698

[22] Filed: Dec. 17, 1990

Related U.S. Application Data

[63] Continuation of Ser. No. 282,540, Dec. 9, 1988, abandoned.

[51] Int. Cl.⁵ .............................................. G06F 12/00
[52] U.S. Cl. .................... 395/575; 364/246.91; 364/271.6
[58] Field of Search ............... 364/DIG. 1, DIG. 2

[56] References Cited

U.S. PATENT DOCUMENTS

| | | | |
|---|---|---|---|
| 3,602,900 | 8/1971 | Delaigue et al. | 364/200 |
| 3,681,578 | 8/1972 | Stevens | 364/200 |
| 3,735,356 | 5/1973 | Harold et al. | 364/200 |
| 3,761,884 | 9/1973 | Avsan et al. | 364/200 |
| 3,810,119 | 5/1974 | Zieve et al. | 364/200 |
| 3,833,798 | 9/1974 | Huber et al. | 364/200 |
| 3,848,116 | 11/1974 | Moder et al. | 364/200 |
| 3,921,149 | 11/1975 | Kreis et al. | 364/200 |
| 4,015,243 | 3/1977 | Kurpanek et al. | 364/200 |
| 4,015,246 | 3/1977 | Hopkins, Jr. et al. | 364/200 |
| 4,034,347 | 7/1977 | Probert, Jr. | 364/200 |
| 4,187,538 | 2/1980 | Douglas et al. | 364/200 |
| 4,224,664 | 9/1980 | Trinchieri | 364/200 |
| 4,234,920 | 11/1980 | Ness | 395/750 |
| 4,253,144 | 2/1981 | Bellamy et al. | 364/200 |
| 4,257,097 | 3/1981 | Moran | 364/200 |
| 4,315,310 | 2/1982 | Bayliss et al. | 364/200 |
| 4,316,245 | 2/1982 | Luu et al. | 364/200 |
| 4,321,666 | 3/1982 | Tasar et al. | 364/200 |
| 4,330,826 | 5/1982 | Whiteside et al. | 364/200 |
| 4,358,823 | 11/1982 | McDonald | 371/9 |
| 4,375,683 | 3/1983 | Wensley | 371/36 |
| 4,380,046 | 4/1983 | Fung | 364/200 |
| 4,392,196 | 7/1983 | Glenn et al. | 364/200 |
| 4,392,199 | 7/1983 | Schmitter et al. | 364/200 |
| 4,399,504 | 8/1983 | Obermarck | 364/200 |
| 4,412,218 | 10/1983 | Niitsu | 340/825.56 |

(List continued on next page.)

FOREIGN PATENT DOCUMENTS

| | | |
|---|---|---|
| 104490 | 9/1983 | European Pat. Off. . |
| 141246 | 9/1984 | European Pat. Off. . |
| 286856 | 3/1988 | European Pat. Off. . |
| 316087 | 10/1988 | European Pat. Off. . |
| 8402001 | 5/1984 | World Int. Prop. O. . |
| WO8502698 | 6/1985 | World Int. Prop. O. . |

OTHER PUBLICATIONS

BiiN 60 TM System Technical Overview.
Cohen, E. I., "Storage Hierarchies," IBM Systems Journal, 1989.

(List continued on next page.)

Primary Examiner—David Y. Eng
Attorney, Agent, or Firm—A. C. Smith

[57] ABSTRACT

A computer system in a fault-tolerant configuration employs three identical CPUs executing the same instruction stream, with two identical, self-checking memory modules storing duplicates of the same data. Memory references by the three CPUs are made by three separate busses connected to three separate ports of each of the two memory modules. The three CPUs are loosely synchronized, as by detecting events such as memory references and stalling any CPU ahead of others until all execute the function simultaneously; interrupts can be synchronized by ensuring that all three CPUs implement the interrupt at the same point in their instruction stream. Memory references via the separate CPU-to-memory busses are voted at the three separate ports of each of the memory modules. Each CPU has a local memory, separate from the memory modules, and this local memory is of the dynamic type so it must be periodically refreshed. The refresh cycles are interposed at the same point in the instruction stream for each of the three CPUs by counting instruction execution cycles separately in each CPU, and interrupting to do a refresh cycle when a given count is reached. Stall cycles are also counted, and when long periods of stalls occur then more than one refresh cycle is interposed to catch up to the needed refresh schedule.

13 Claims, 12 Drawing Sheets

U.S. PATENT DOCUMENTS

| | | | |
|---|---|---|---|
| 4,412,281 | 10/1983 | Works | 364/200 |
| 4,414,624 | 11/1983 | Summer, Jr. et al. | 364/200 |
| 4,426,681 | 1/1984 | Bacot et al. | 364/200 |
| 4,430,707 | 2/1984 | Kim | 364/200 |
| 4,432,051 | 2/1984 | Bogaert et al. | 364/200 |
| 4,438,494 | 3/1984 | Badde | 371/11 |
| 4,455,605 | 6/1984 | Cormier et al. | 364/200 |
| 4,458,307 | 7/1984 | McAnlis | 365/228 |
| 4,493,019 | 1/1985 | Kim et al. | 364/200 |
| 4,497,059 | 1/1985 | Smith | 371/36 |
| 4,541,094 | 9/1985 | Stiffler et al. | 371/68 |
| 4,564,903 | 1/1986 | Guyette et al. | 364/200 |
| 4,570,261 | 2/1986 | Maher | 371/16 |
| 4,577,272 | 3/1986 | Ballow | 364/200 |
| 4,589,066 | 5/1986 | Lam et al. | 364/200 |
| 4,591,977 | 5/1986 | Nissen et al. | 364/200 |
| 4,597,084 | 6/1986 | Dynneson et al. | 371/51 |
| 4,607,365 | 8/1986 | Greig et al. | 371/8 |
| 4,616,312 | 10/1986 | Uebel | 364/200 |
| 4,633,394 | 12/1986 | Georgiou | 364/200 |
| 4,638,427 | 1/1987 | Martin | 364/200 |
| 4,644,498 | 2/1987 | Bedard | 364/900 |
| 4,646,231 | 2/1987 | Green et al. | 364/200 |
| 4,648,035 | 3/1987 | Fava et al. | 364/200 |
| 4,661,900 | 4/1987 | Chen et al. | 364/200 |
| 4,667,287 | 5/1987 | Allen et al. | 364/200 |
| 4,672,535 | 6/1987 | Katzman et al. | 364/200 |
| 4,683,570 | 7/1987 | Bedard et al. | 371/36 |
| 4,703,452 | 10/1987 | Abrant et al. | 364/200 |
| 4,709,325 | 11/1987 | Yajima | 364/900 |
| 4,733,353 | 3/1988 | Jaswa | 364/200 |
| 4,751,639 | 6/1988 | Corcoran et al. | 364/200 |
| 4,757,442 | 7/1988 | Sakata | 364/200 |
| 4,757,505 | 7/1988 | Marrington | 371/66 |
| 4,763,333 | 8/1988 | Byrd | 371/66 |
| 4,774,709 | 9/1988 | Tulplue et al. | 371/11 |
| 4,779,008 | 10/1988 | Kessels | 307/269 |
| 4,783,731 | 11/1988 | Miyazaki et al. | 364/200 |
| 4,783,733 | 11/1988 | Greig et al. | 364/200 |
| 4,785,453 | 11/1988 | Chandran et al. | 371/78 |
| 4,794,601 | 12/1988 | Kikuchi | 371/36 |
| 4,799,140 | 1/1989 | Dietz et al. | 364/140 |
| 4,800,462 | 1/1989 | Zacher et al. | 361/413 |
| 4,805,107 | 2/1989 | Kieckhafer et al. | 364/200 |
| 4,816,900 | 3/1989 | Williams | 358/75 |
| 4,819,159 | 4/1989 | Shipley et al. | 364/200 |
| 4,823,256 | 4/1989 | Bishop | 371/9 |
| 4,827,401 | 5/1989 | Hrustich et al. | 364/200 |
| 4,831,520 | 5/1989 | Rubinfeld et al. | 364/200 |
| 4,845,419 | 7/1989 | Hacker | 320/39 |
| 4,847,837 | 7/1989 | Morales et al. | 371/8 |
| 4,849,979 | 7/1989 | Maccianti | 371/68 |
| 4,853,872 | 8/1989 | Shimoi | 364/200 |
| 4,868,818 | 9/1989 | Madan et al. | 371/11 |
| 4,868,826 | 9/1989 | Smith et al. | 371/9.1 |
| 4,868,832 | 9/1989 | Marrington | 371/66 |
| 4,873,685 | 10/1989 | Millis, Jr. | 371/36 |
| 4,879,716 | 11/1989 | McNally | 371/8.2 |
| 4,907,232 | 3/1990 | Harper | 371/36 |
| 4,912,698 | 3/1990 | Bitzinger | 370/13 |
| 4,914,657 | 4/1990 | Walter et al. | 371/11.3 |
| 4,933,940 | 6/1990 | Walter | 371/9.1 |

OTHER PUBLICATIONS

Davies, Daniel, "Synchronization and Matching in Redundant Systems", IEEE 1978.

Enslow, Philip, Editor, "Multiprocessors and Parallel Processing," Comtre Corporation, 1974 John Wiley & Sons.

Frison, Steven G., "Interactive Consistency and Its Impact on the Design of the TMR Systems," August Systems, Inc., IEEE 1982.

Hopkins, Albert L., Jr., "A Fault-Tolerant Information Processing Concept for Space Vehicles," IEEE Transactions on Computers, Nov. 1971.

Kilmer, F., "Comparison of Synchronization Techniques for Redundant Computer Sets," IBM Federal Systems Division, Mar. 22, 1974.

McCluskey, E. J., "Comparative Architecture of High-Availability Computer Systems," IEEE, Digest of Papers, COMP-CON, Spring 1977.

NCR 9800 System Technical Overview.

Smith, T. Basil, III, "Architectural Description of a Fault-Tolerant Multiprocessor Engineering Prototype," IEEE 1978.

Smith, Basil T., "High Performance Fault Tolerant Real Time Computer Architecture," IEEE 1986.

Tolerant Systems, Eternity Series System Summary, Revision 2.0. Jan. 1984.

(List continued on next page.)

OTHER PUBLICATIONS

Weinstock, Charles B., "SIFT: Systems Design and Implementation," IEEE 1980.

Wensley, John H., "Fault Tolerant Systems Can Prevent Timing Problems," Computer Design, Nov. 1982.

Yoneda, Tomohiro, "Implementation of Interrupt Handler for Loosely-Synchronized TMR Systems," IEEE 1985.

Chang, "Multiple-Read Single-Write Memory and Its Applications", 1980 IEEE Transaction on Computers, vol. C-29, No. 8.

Daniel Davies and John Wakerly; "Synchronization and Matching in Redundant Systems"; IEEE Trans. on Computers; Jun. 1978; pp. 531-539.

Yoneda, Suzuoka and Tohma; "Implementation of Interrupt Handler for Loosely-Synchronized TMR Systems"; IEEE Trans. on Computers; 1985; pp. 246-251.

Stephen R. McConnel and Daniel P. Siewiorek; "Synchronization and Voting"; IEEE Trans. on Computers; Feb. 1981; pp. 161-164.

T. Basil Smith; "High Performance Fault Tolerant Real Time Computer Architecture"; IEEE Trans. on Computers; 1986; pp. 14-19.

Charles B. Weinstock; "SIFT: System Design and Implementation"; IEEE Trans. on Computers; 1980; pp. 75-77.

Steven G. Frison and John H. Wensley; "Interactive Consistency and Its Impact on the Design of RMR Systems"; IEEE Trans. on Computers; 1982; pp. 228-233.

Albert L. Hopkins, Jr.; "A Fault-Tolerant Information Processing Concept for Space Vehicles"; IEEE Trans. on Computers; Nov. 1971; pp. 1394-1403.

J. R. Sklaroff; "Redundancy Management Technique for Space Shuttle Computers"; IBM J. Res. Develop.; pp. 20-28.

F. Kilmer, L. Killingbeck and J. Viskne; "Comparison of Synchronization Techniques for Redundant Computer Sets"; IBM Federal Systems Division Electronics Systems; Mar. 22, 1974.

Philip H. Enslow, Jr.; "Multiprocessors and Parallel Processing"; Copyright 1974 by John Wiley & Sons, Inc.; pp. 28-33.

"Eternity Series System Summary"; Copyright 1984 Tolerant Systems.

"Computer System Isolates Faults"; Special Report on Minicomputer Systems-Reprint-Computer Design-Nov. 1983.

"NCR 9800 System Series-Technical Overview" Copyright 1986 NCR Corporation.

BiiN 60 System Technical Overview.

D. Nadel, "Closely Coupled asynchronous hierarchical and parallel processing in an open architecture," The 12th Annual International Symposium on Computer Architecture, Conference Proceedings, Boston, Mass., Jun. 17-19, 1985 pp. 215-220.

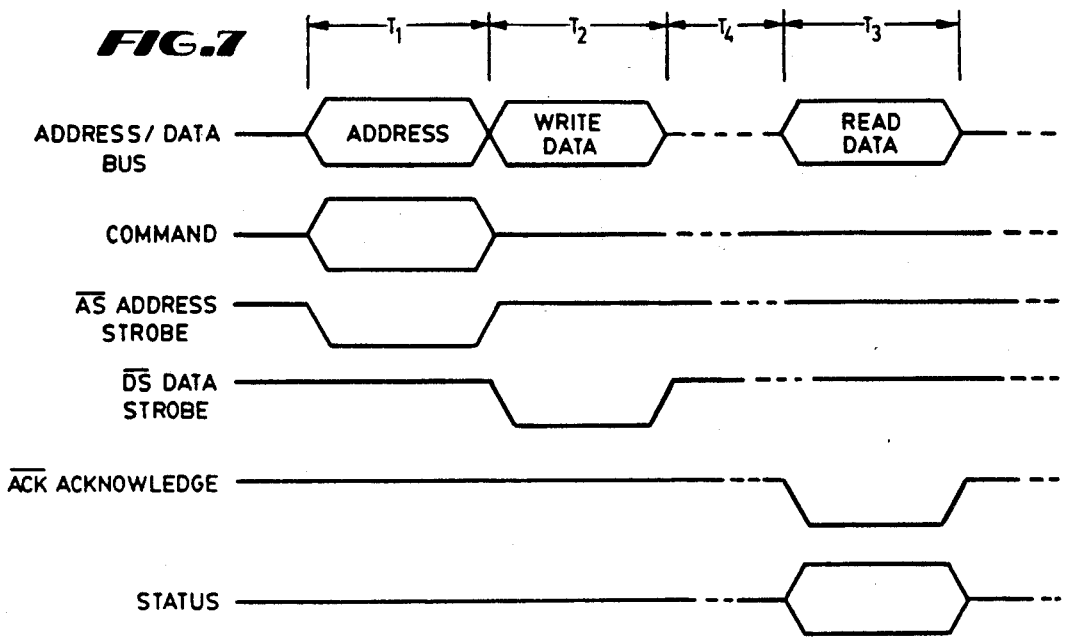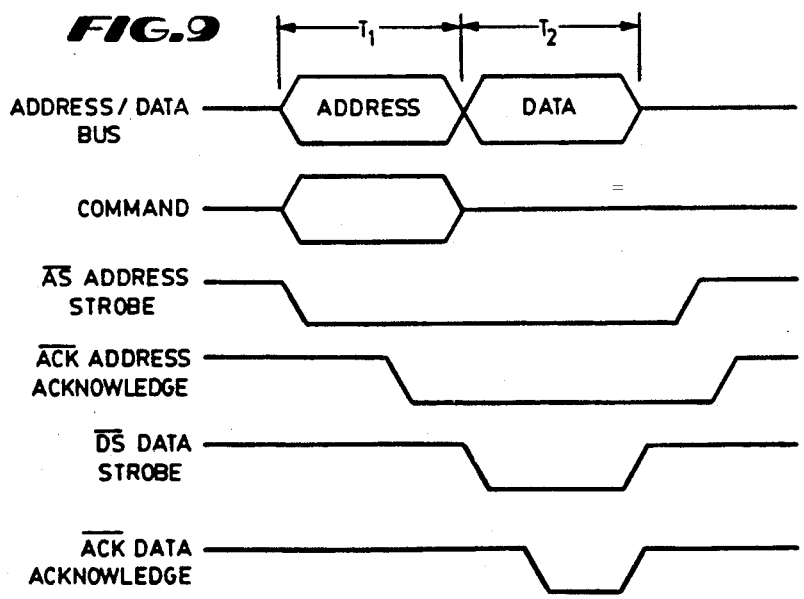

| CPU - A | $I_0$ | $I_1$ | $I_2$ | $I_3$ | $I_4$ | $I_5$ | $I_6$ | $I_7$ | $I_8$ | $I_9$ | $I_{10}$ | $I_{11}$ | $I_{12}$ |
|---|---|---|---|---|---|---|---|---|---|---|---|---|---|
| CPU - B | $I_6$ | $I_7$ | $I_8$ | $I_9$ | $I_{10}$ | $I_{11}$ | $I_{12}$ | $I_{13}$ | $I_{14}$ | $I_{15}$ | $I_{16}$ | $I_{17}$ | $I_{18}$ |
| CPU - C | $I_1$ | $I_2$ | $I_3$ | $I_4$ | $I_5$ | $I_6$ | $I_7$ | $I_8$ | $I_9$ | $I_{10}$ | $I_{11}$ | $I_{12}$ | $I_{13}$ |
| | $t_0$ | $t_1$ | $t_2$ | $t_3$ | $t_4$ | $t_5$ | $t_6$ | $t_7$ | $t_8$ | $t_9$ | $t_{10}$ | $t_{11}$ | $t_{12}$ |

FIG.10

| $I_0$ | $I_1$ | $I_2$ |
|---|---|---|
| $I_6$ | $I_7$ | $I_8$ |
| $I_1$ | $I_2$ | $I_3$ |

FIG.10a

| CPU - A | 0 | 1 | 2 | 3 | 4 | 4 | 4 | 4 | 5 | 6 | 7 |
|---|---|---|---|---|---|---|---|---|---|---|---|
| CPU - B | 2 | 3 | 4 | 4 | 4 | 4 | 4 | 4 | 5 | 6 | 7 |
| CPU - C | 3 | 4 | 4 | 4 | 4 | 4 | 4 | 4 | 5 | 6 | 7 |
| | $t_0$ | $t_1$ | $t_2$ | $t_3$ | $t_4$ | $t_5$ | $t_6$ | $t_7$ | $t_8$ | $t_9$ | $t_{10}$ | $t_{11}$ |

FIG.11

| CPU - A | 0 | 1 | 2 | 3 | 4 | 5 | 6 | 7 | 8 | 9 | 10 | 11 |
|---|---|---|---|---|---|---|---|---|---|---|---|---|
| AWB | | | | | | | ⎍ | | | | | |
| CPU - B | 3 | 4 | 5 | 6 | 7 | 7 | 7 | 7 | 8 | 9 | 10 | 11 |
| BWB | | | | | | | ⎍ | | | | | |
| | $t_0$ | $t_1$ | $t_2$ | $t_3$ | $t_4$ | $t_5$ | $t_6$ | $t_7$ | $t_8$ | $t_9$ | $t_{10}$ | $t_{11}$ |

FIG.12

IRQ ↓

FIG.16

| CPU - A | 0 | 1 | 2 | 3 | 4 | 5 | 6 | 7 | 8 | 9 | 10 | 11 |
|---|---|---|---|---|---|---|---|---|---|---|---|---|
| CPU - B | 3 | 4 | 5 | 6 | 7 | 8 | 9 | 10 | 11 | 12 | 13 | 14 |
| | $t_0$ | $t_1$ | $t_2$ | $t_3$ | $t_4$ | $t_5$ | $t_6$ | $t_7$ | $t_8$ | $t_9$ | $t_{10}$ | $t_{11}$ |

IRQ ↓

FIG.17

| CPU - A | $0_0$ | 1 | 2 | 3 | $0_1$ | 1 | 2 | 3 | $0_2$ | 1 | 2 | 3 |
|---|---|---|---|---|---|---|---|---|---|---|---|---|
| CPU - B | 3 | $0_1$ | 1 | 2 | 3 | $0_2$ | 1 | 2 | 3 | $0_3$ | 1 | 2 |
| | $t_0$ | $t_1$ | $t_2$ | $t_3$ | $t_4$ | $t_5$ | $t_6$ | $t_7$ | $t_8$ | $t_9$ | $t_{10}$ | $t_{11}$ |

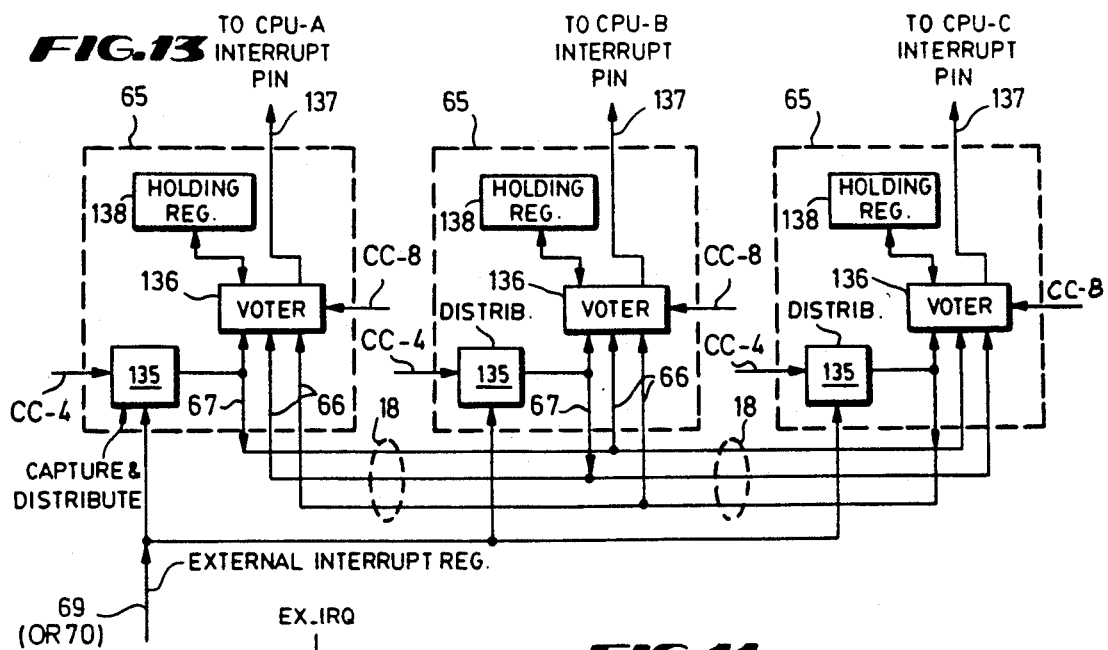

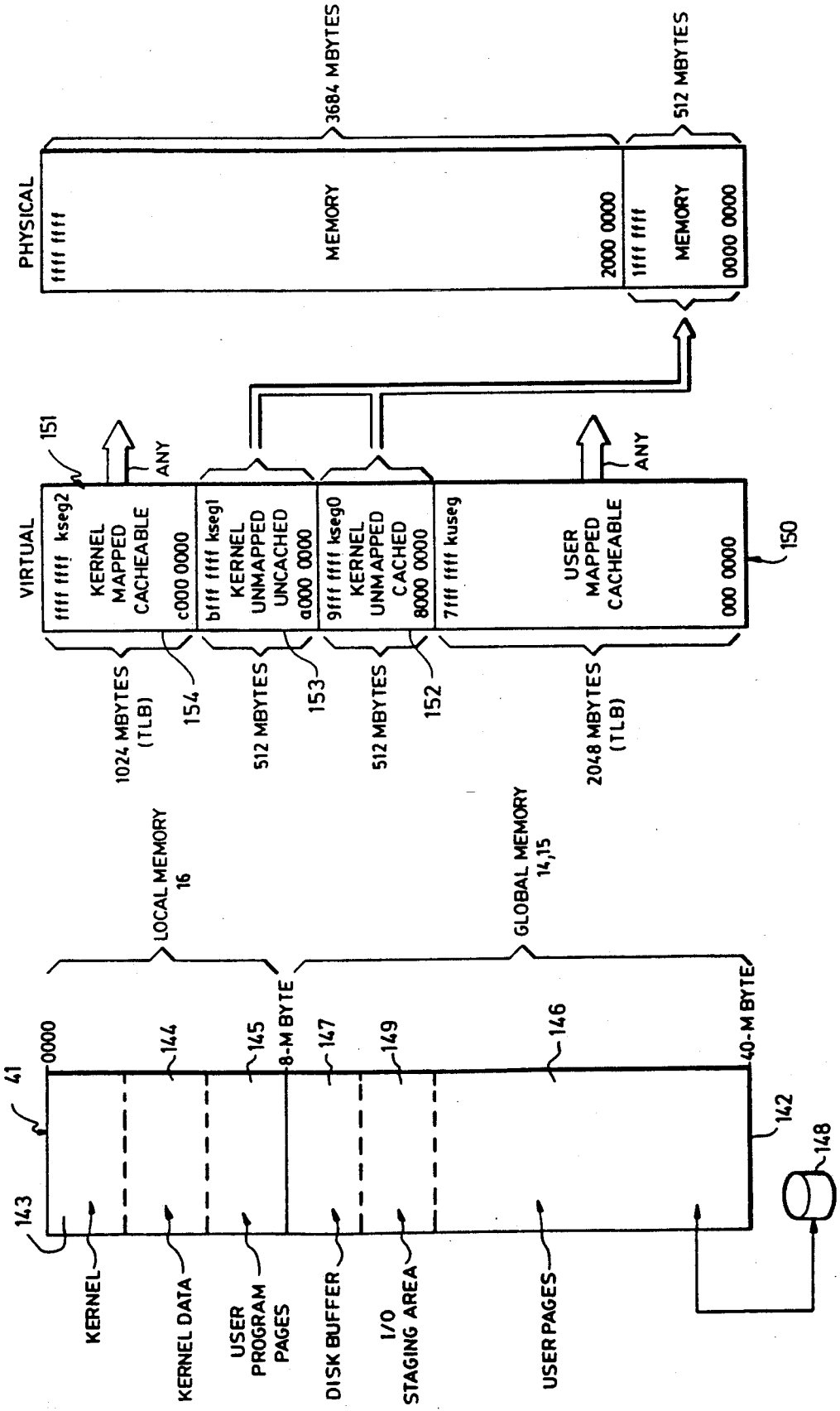

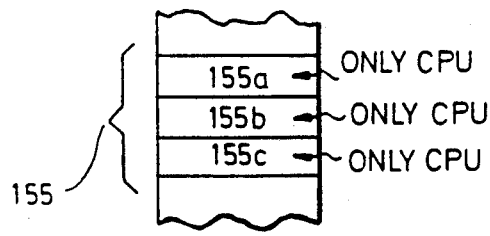
FIG.21
FIG.20
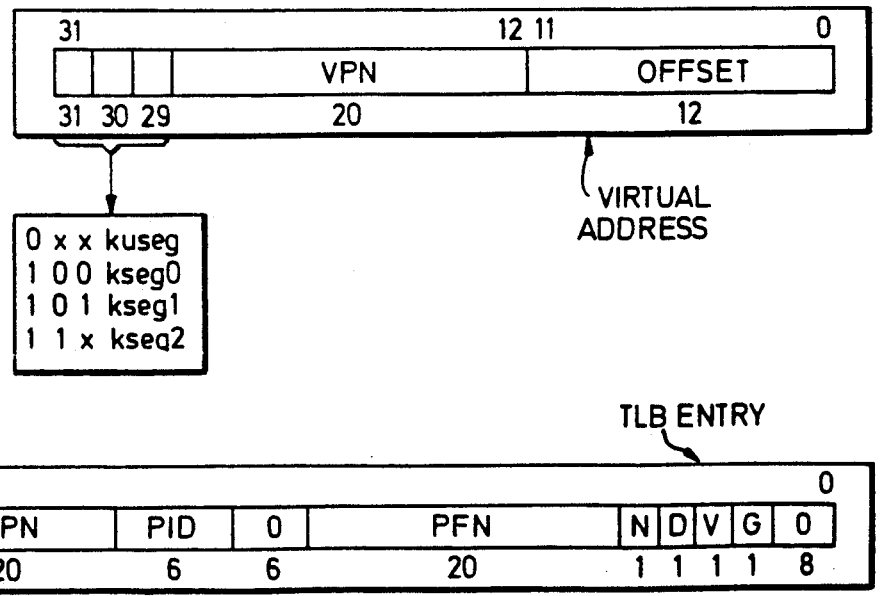

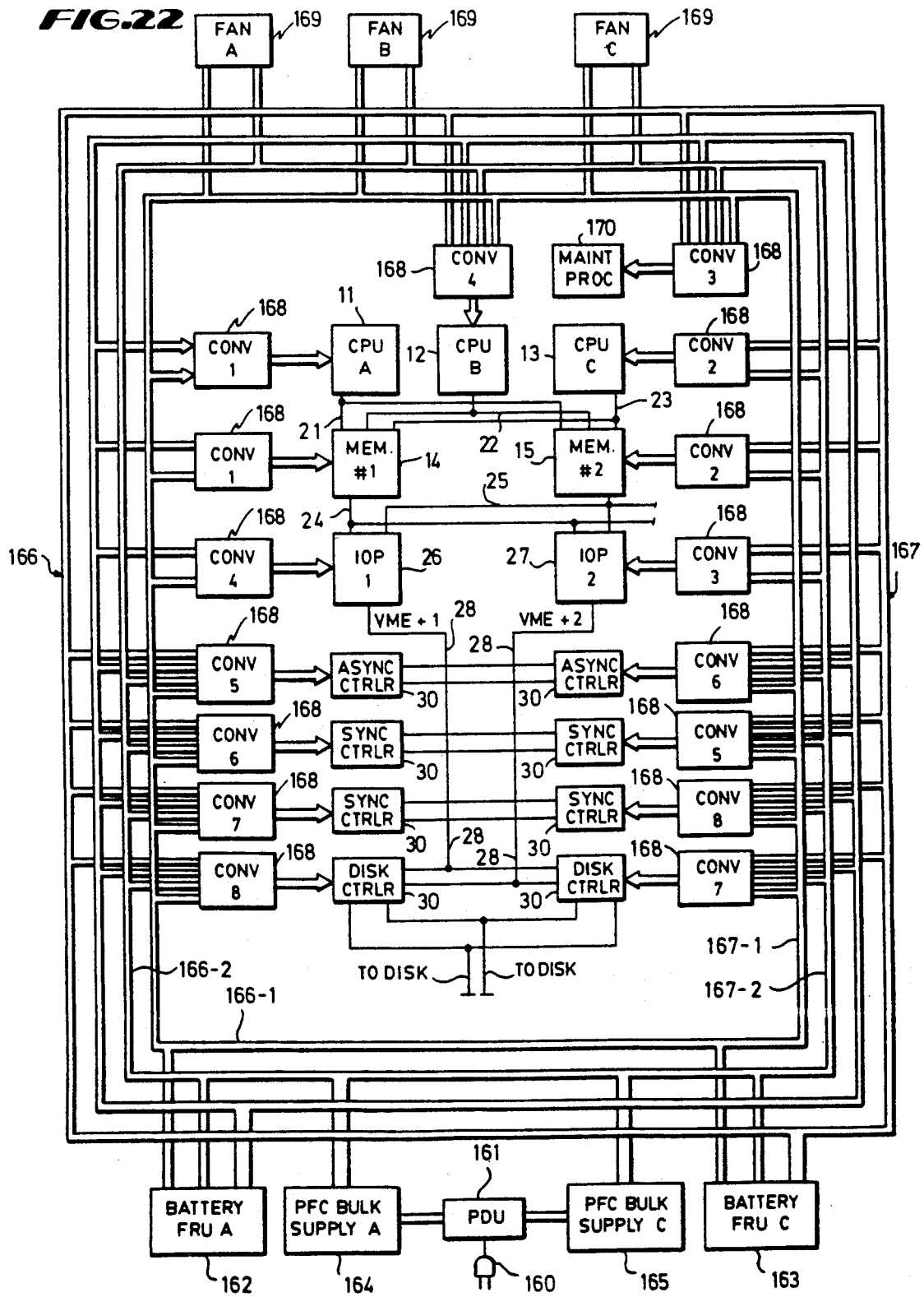

REFRESH CONTROL FOR DYNAMIC MEMORY IN MULTIPLE PROCESSOR SYSTEM

This is a continuation of co-pending application Ser. No. 07/282,540 filed on Dec. 9, 1988 now abandoned.

RELATED CASES

This application discloses subject matter also disclosed in copending application Ser. Nos. 282,469, 282,538, 282,629, 283,139 and 283,141, filed Dec. 9, 1988, and Ser. Nos. 283,573 and 283,574, filed Dec. 13, 1988, and further discloses subject matter also disclosed in prior copending application Ser. No. 118,503, filed Nov. 9, 1987, all of said applications being assigned to Tandem Computers Incorporated, the assignee of this invention.

BACKGROUND OF THE INVENTION

This invention relates to computer systems, and more particularly to a refresh control for dynamic memory in a multiple processor fault-tolerant system using multiple CPUs.

Highly reliable digital processing is achieved in various computer architectures employing redundancy. For example, TMR (triple modular redundancy) systems may employ three CPUs executing the same instruction stream, along with three separate main memory units and separate I/O devices which duplicate functions, so if one of each type of element fails, the system continues to operate. Another fault-tolerant type of system is shown in U.S. Pat. No. 4,228,496, issued to Katzman et al, for "Multiprocessor System", assigned to Tandem Computers Incorporated. Various methods have been used for synchronizing the units in redundant systems; for example, in said prior application Ser. No. 118,503, filed Nov. 9, 1987, by R. W. Horst, for "Method and Apparatus for Synchronizing a Plurality of Processors", also assigned to Tandem Computers Incorporated, a method of "loose" synchronizing is disclosed, in contrast to other systems which have employed a lock-step synchronization using a single clock, as shown in U.S. Pat. No. 4,453,215 for "Central Processing Apparatus for Fault-Tolerant Computing", assigned to Stratus Computer, Inc. A technique called "synchronization voting" is disclosed by Davies & Wakerly in "Synchronization and Matching in Redundant Systems", IEEE Transactions on Computers June 1978, pp. 531–539. A method for interrupt synchronization in redundant fault-tolerant systems is disclosed by Yondea et al in Proceeding of 15th Annual Symposium on Fault-Tolerant Computing, June 1985, pp. 246–251, "Implementation of Interrupt Handler for Loosely Synchronized TMR Systems". U.S. Pat. No. 4,644,498 for "Fault-Tolerant Real Time Clock" discloses a triple modular redundant clock configuration for use in a TMR computer system. U.S. Pat. No. 4,733,353 for "Frame Synchronization of Multiply Redundant Computers" discloses a synchronization method using separately-clocked CPUs which are periodically synchronized by executing a synch frame.

As high-performance microprocessor devices have become available, using higher clock speeds and providing greater capabilities, such as the Intel 80386 and Motorola 68030 chips operating at 25-MHz clock rates, and as other elements of computer systems such as memory, disk drives, and the like have correspondingly become less expensive and of greater capability, the performance and cost of high-reliability processors has been required to follow the same trends. In addition, standardization on a few operating systems in the computer industry in general has vastly increased the availability of applications software, so a similar demand is made on the field of high-reliability systems; i.e., a standard operating system must be available.

It is therefore the principal object of this invention to provide an improved high-reliability computer system, particularly of the fault-tolerant type. Another object is to provide an improved redundant, fault-tolerant type of computing system, and one in which high performance and reduced cost are both possible; particularly, it is preferable that the improved system avoid the performance burdens usually associated with highly redundant systems. A further object is to provide a high-reliability computer system in which the performance, measured in reliability as well as speed and software compatibility, is improved but yet at a cost comparable to other alternatives of lower performance. An additional object is to provide a high-reliability computer system which is capable of executing an operating system which uses virtual memory management with demand paging, and having protected (supervisory or "kernel") mode; particularly an operating system also permitting execution of multiple processes; all at a high level of performance.

SUMMARY OF THE INVENTION

In accordance with one embodiment of the invention, a computer system employs three identical CPUs typically executing the same instruction stream, and has two identical, self-checking memory modules storing duplicates of the same data. A configuration of three CPUs and two memories is therefore employed, rather than three CPUs and three memories as in the classic TMR systems. Memory references by the three CPUs are made by three separate busses connected to three separate ports of each of the two memory modules. In order to avoid imposing the performance burden of fault-tolerant operation on the CPUs themselves, and imposing the expense, complexity and timing problems of fault-tolerant clocking, the three CPUs each have their own separate and independent clocks, but are loosely synchronized, as by detecting events such as memory references and stalling any CPU ahead of others until all execute the function simultaneously; the interrupts are also synchronized to the CPUs ensuring that the CPUs execute the interrupt at the same point in their instruction stream. The three asynchronous memory references via the separate CPU-to-memory busses are voted at the three separate ports of each of the memory modules at the time of the memory request, but read data is not voted when returned to the CPUs.

The two memories both perform all write requests received from either the CPUs or the I/O busses, so that both are kept up-to-date, but only one memory module presents read data back to the CPUs or I/Os in response to read requests; the one memory module producing read data is designated the "primary" and the other is the back-up. Accordingly, incoming data is from only one source and is not voted. The memory requests to the two memory modules are implemented while the voting is still going on, so the read data is available to the CPUs a short delay after the last one of the CPUs makes the request. Even write cycles can be substantially overlapped because DRAMs used for these memory modules use a large part of the write access to merely read and refresh, then if not strobed for the last part of the write cycle the read is non-destructive; therefore, a write cycle begins as soon as the first CPU makes a request, but does not complete until the last request has been received and voted good. These features of non-voted read-data returns and overlapped accesses allow fault-tolerant operation at high performance, but yet at minimum complexity and expense.

I/O functions are implemented using two identical I/O busses, each of which is separately coupled to only one of the memory modules. A number of I/O processors are coupled to both I/O busses, and I/O devices are coupled to pairs of the I/O processors but accessed by only one of the I/O processors. Since one memory module is designated primary, only the I/O bus for this module will be controlling the I/O processors, and I/O traffic between memory module and I/O is not voted. The CPUs can access the I/O processors through the memory modules (each access being voted just as the memory accesses are voted), but the I/O processors can only access the memory modules, not the CPUs; the I/O processors can only send interrupts to the CPUs, and these interrupts are collected in the memory modules before presenting to the CPUs. Thus synchronization overhead for I/O device access is not burdening the CPUs, yet fault tolerance is provided. If an I/O processor fails, the other one of the pair can take over control of the I/O devices for this I/O processor by merely changing the addresses used for the I/O device in the I/O page table maintained by the operating system. In this manner, fault tolerance and reintegration of an I/O device is possible without system shutdown, and yet without hardware expense and performance penalty associated with voting and the like in these I/O paths.

The memory system used in the illustrated embodiment is hierarchical at several levels. Each CPU has its own cache, operating at essentially the clock speed of the CPU. Then each CPU has a local memory not accessible by the other CPUs, and virtual memory management allows the kernel of the operating system and pages for the current task to be in local memory for all three CPUs, accessible at high speed without fault-tolerance overhead such as voting or synchronizing imposed. Next is the memory module level, referred to as global memory, where voting and synchronization take place so some access-time burden is introduced; nevertheless, the speed of the global memory is much faster than disk access, so this level is used for page swapping with local memory to keep the most-used data in the fastest area, rather than employing disk for the first level of demand paging.

One of the features of the disclosed embodiment of the invention is ability to replace faulty components, such as CPU modules or memory modules, without shutting down the system. Thus, the system is available for continuous use even though components may fail and have to be replaced. In addition, the ability to obtain a high level of fault tolerance with fewer system components, e.g., no fault-tolerant clocking needed, only two memory modules needed instead of three, voting circuits minimized, etc., means that there are fewer components to fail, and so the reliability is enhanced. That is, there are fewer failures because there are fewer components, and when there are failures the components are isolated to allow the system to keep running, while the components can be replaced without system shutdown.

The CPUs of this system preferably use a commercially-available highperformance microprocessor chip for which operating systems such as Unix TM are available. The parts of the system which make it fault-tolerant are either transparent to the operating system or easily adapted to the operating system. Accordingly, a high-performance fault-tolerant system is provided which allows comparability with contemporary widely-used multi-tasking operating system and applications software.

BRIEF DESCRIPTION OF THE DRAWINGS

The features believed characteristic of the invention are set forth in the appended claims. The invention itself, however, as well as other features and advantages thereof, may best be understood by reference to the detailed description of a specific embodiment which follows, when read in conjunction with the accompanying drawings, wherein:

FIG. 7 is a timing diagram showing events occurring on the CPU to memory busses in the system of FIG. 1;

FIG. 9 is a timing diagram showing events vs. time for the transfer protocol between a memory module and an I/O processor in the system of FIG. 1;

FIG. 10 is a timing diagram showing events vs. time for execution of instructions in the CPUs of FIGS. 1, 2 and 3;

FIG. 10a is a detail view of a part of the diagram of FIG. 10;

FIGS. 11 and 12 are timing diagrams similar to FIG. 10 showing events vs. time for execution of instructions in the CPUs of FIGS. 1, 2 and 3;

FIG. 13 is an electrical schematic diagram in block form of the interrupt synchronization circuit used in the CPU of FIG. 2;

FIGS. 14, 15, 16 and 17 are timing diagrams like FIGS. 10 or 11 showing events vs. time for execution of instructions in the CPUs of FIGS. 1, 2 and 3 when an interrupt occurs, illustrating various scenarios;

FIG. 18 is a physical memory map of the memories used in the system of FIGS. 1, 2, 3 and 6;

FIG. 19 is a virtual memory map of the CPUs used in the system of FIGS. 1, 2, 3 and 6;

FIG. 20 is a diagram of the format of the virtual address and the TLB entries in the microprocessor chips in the CPU according to FIGS. 2 or 3;

FIG. 21 is an illustration of the private memory locations in the memory map of the global memory modules in the system of FIGS. 1, 2, 3 and 6; and FIG. 22 is an electrical diagram of a fault-tolerant power supply used with the system of the invention according to one embodiment.

DETAILED DESCRIPTION OF SPECIFIC EMBODIMENT

Figure 1:
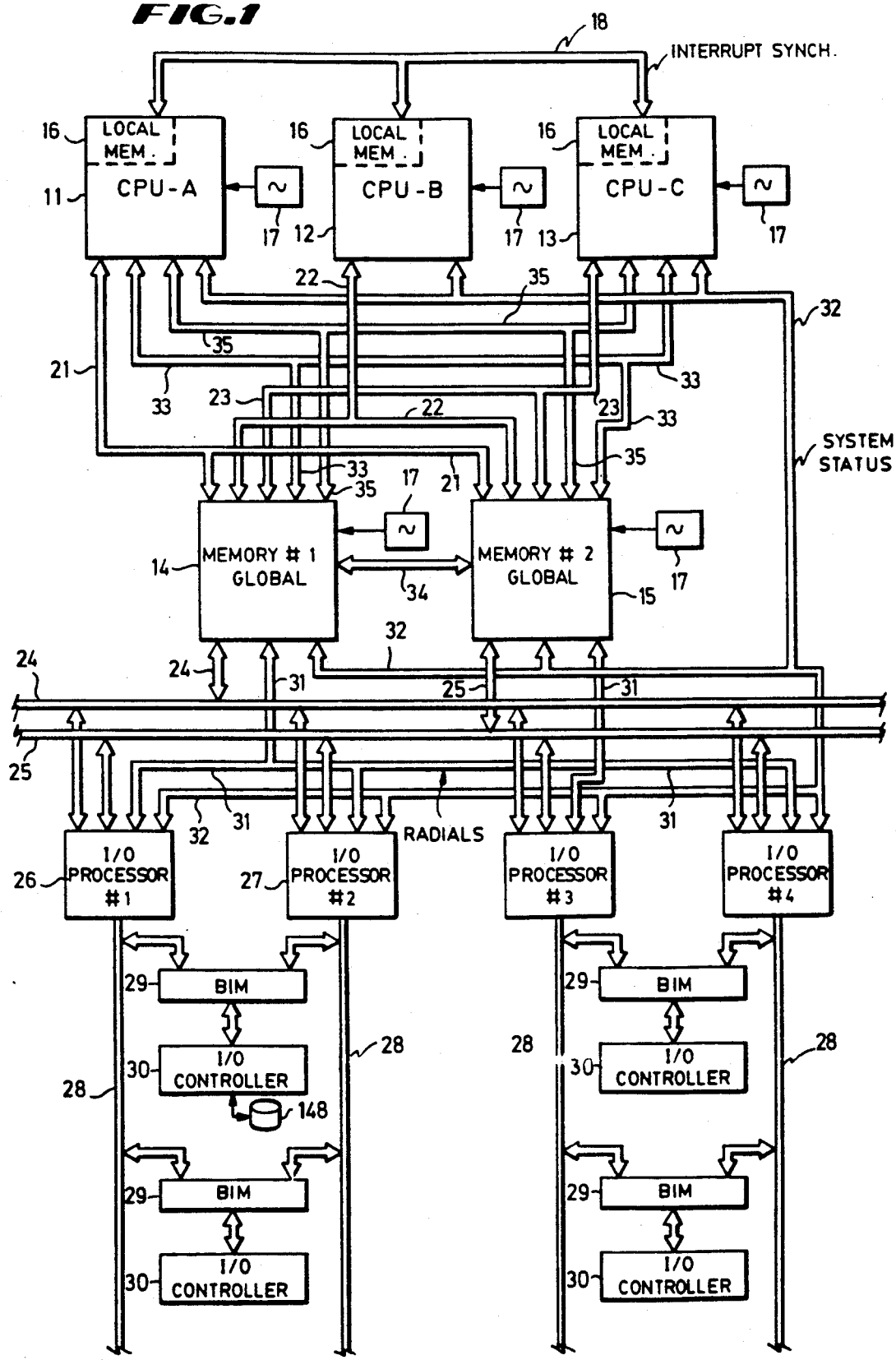
FIG. 1 is an electrical diagram in block form of a computer system according to one embodiment of the invention.

With reference to FIG. 1, a computer system using features of the invention is shown in one embodiment having three identical processors 11, 12 and 13, referred to as CPU-A, CPU-B and CPU-C, which operate as one logical processor, all three typically executing the same instruction stream; the only time the three processors are not executing the same instruction stream is in such operations as power-up self test, diagnostics and the like. The three processors are coupled to two memory modules 14 and 15, referred to as Memory-#1 and Memory-#2, each memory storing the same data in the same address space. In a preferred embodiment, each one of the processors 11, 12 and 13 contains its own local memory 16, as well, accessible only by the processor containing this memory.

Each one of the processors 11, 12 and 13, as well as each one of the memory modules 14 and 15, has its own separate clock oscillator 17; in this embodiment, the processors are not run in "lock step", but instead are loosely synchronized by a method such as is set forth in the above-mentioned application Ser. No. 118,503, i.e., using events such as external memory references to bring the CPUs into synchronization. External interrupts are synchronized among the three CPUs by a technique employing a set of busses 18 for coupling the interrupt requests and status from each of the processors to the other two; each one of the processors CPU-A, CPU-B and CPU-C is responsive to the three interrupt requests, its own and the two received from the other CPUs, to present an interrupt to the CPUs at the same point in the execution stream. The memory modules 14 and 15 vote the memory references, and allow a memory reference to proceed only when all three CPUs have made the same request (with provision for faults). In this manner, the processors are synchronized at the time of external events (memory references), resulting in the processors typically executing the same instruction stream, in the same sequence, but not necessarily during aligned clock cycles in the time between synchronization events. In addition, external interrupts are synchronized to be executed at the same point in the instruction stream of each CPU.

The CPU-A processor 11 is connected to the Memory-#1 module 14 and to the Memory-#2 module 15 by a bus 21; likewise the CPU-B is connected to the modules 14 and 15 by a bus 22, and the CPU-C is connected to the memory modules by a bus 23. These busses 21, 22, 23 each include a 32-bit multiplexed address/data bus, a command bus, and control lines for address and data strobes. The CPUs have control of these busses 21, 22 and 23, so there is no arbitration, or bus-request and bus-grant.

Each one of the memory modules 14 and 15 is separately coupled to a respective input/output bus 24 or 25, and each of these busses is coupled to two (or more) input/output processors 26 and 27. The system can have multiple I/O processors as needed to accommodate the I/O devices needed for the particular system configuration. Each one of the input/output processors 26 and 27 is connected to a bus 28, which may be of a standard configuration such as a VMEbus TM, and each bus 28 is connected to one or more bus interface modules 29 for interface with a standard I/O controller 30. Each bus interface module 29 is connected to two of the busses 28, so failure of one I/O processor 26 or 27, or failure of one of the bus channels 28, can be tolerated. The I/O processors 26 and 27 can be addressed by the CPUs 11, 12 and 13 through the memory modules 14 and 15, and can signal an interrupt to the CPUs via the memory modules. Disk drives, terminals with CRT screens and keyboards, and network adapters, are typical peripheral devices operated by the controllers 30. The controllers 30 may make DMA-type references to the memory modules 14 and 15 to transfer blocks of data. Each one of the I/O processors 26, 27, etc., has certain individual lines directly connected to each one of the memory modules for bus request, bus grant, etc.; these point-to-point connections are called "radials" and are included in a group of radial lines 31.

A system status bus 32 is individually connected to each one of the CPUs 11, 12 and 13, to each memory module 14 and 15, and to each of the I/O processors 26 and 27, for the purpose of providing information on the status of each element. This status bus provides information about which of the CPUs, memory modules and I/O processors is currently in the system and operating properly.

An acknowledge/status bus 33 connecting the three CPUs and two memory modules includes individual lines by which the modules 14 and 15 send acknowledge signals to the CPUs when memory requests are made by the CPUs, and at the same time a status field is sent to report on the status of the command and whether it executed correctly. The memory modules not only check parity on data read from or written to the global memory, but also check parity on data passing through the memory modules to or from the I/O busses 24 and 25, as well as checking the validity of commands. It is through the status lines in bus 33 that these checks are reported to the CPUs 11, 12 and 13, so if errors occur a fault routine can be entered to isolate a faulty component.

Even though both memory modules 14 and 15 are storing the same data in global memory, and operating to perform every memory reference in duplicate, one of these memory modules is designated as primary and the other as back-up, at any given time. Memory write operations are executed by both memory modules so both are kept current, and also a memory read operation is executed by both, but only the primary module actually loads the read-data back onto the busses 21, 22 and 23, and only the primary memory module controls the arbitration for multi-master busses 24 and 25. To keep the primary and back-up modules executing the same operations, a bus 34 conveys control information from primary to back-up. Either module can assume the role of primary at boot-up, and the roles can switch during operation under software control; the roles can also switch when selected error conditions are detected by the CPUs or other error-responsive parts of the system.

Certain interrupts generated in the CPUs are also voted by the memory modules 14 and 15. When the CPUs encounter such an interrupt condition (and are not stalled), they signal an interrupt request to the memory modules by individual lines in an interrupt bus 35, so the three interrupt requests from the three CPUs can be voted. When all interrupts have been voted, the memory modules each send a votedinterrupt signal to the three CPUs via bus 35. This voting of interrupts also functions to check on the operation of the CPUs. The three CPUs synch the voted interrupt CPU interrupt signal via the inter-CPU bus 18 and present the interrupt to the processors at a common point in the instruction stream. This interrupt synchronization is accomplished without stalling any of the CPUs.

CPU Module

Figure 2:
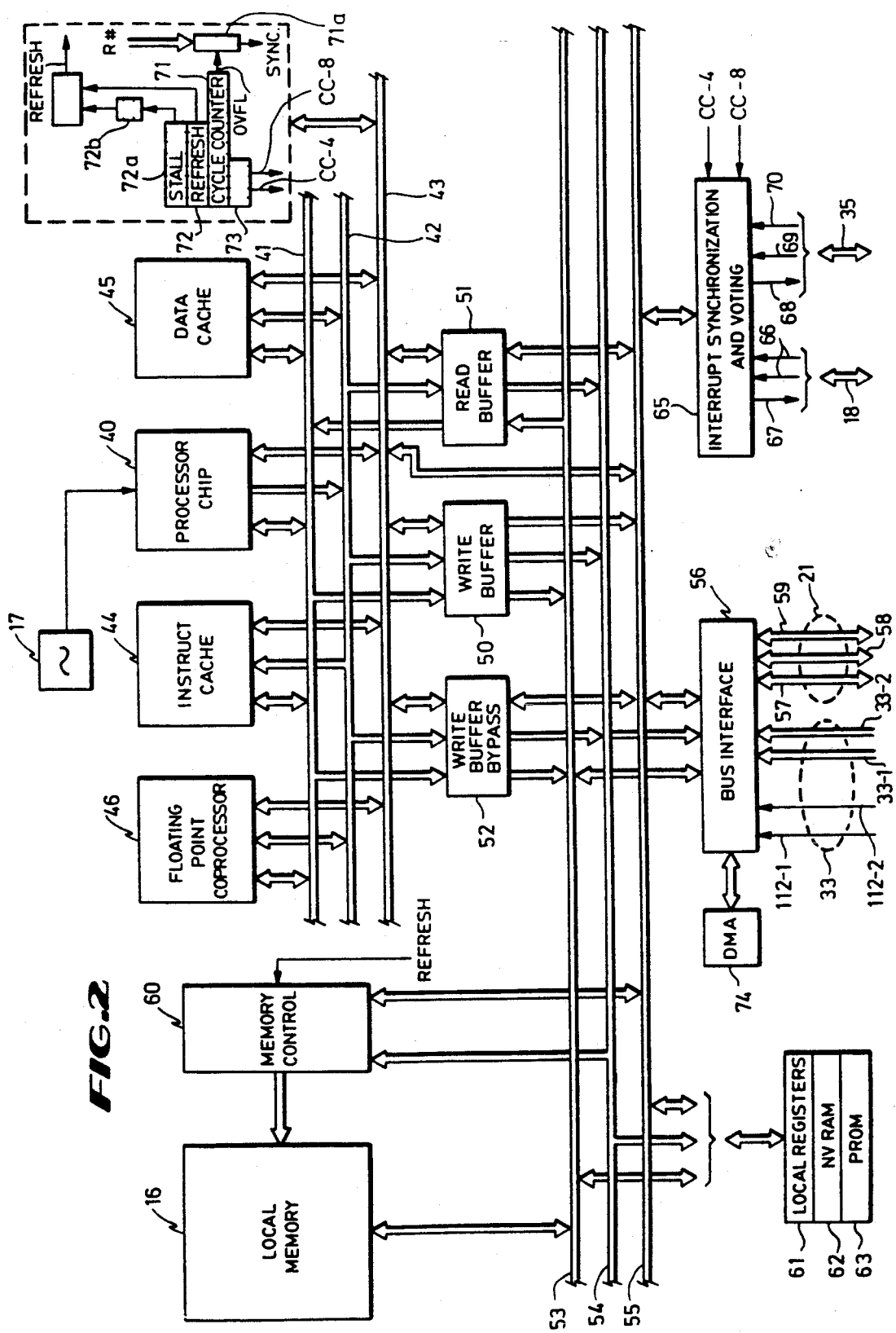
FIG. 2 is an electrical schematic diagram in block form of one of the CPUs of the system of FIG. 1.

Referring now to FIG. 2, one of the processors 11, 12 or 13 is shown in more detail. All three CPU modules are of the same construction in a preferred embodiment, so only CPU-A will be described here. In order to keep costs within a competitive range, and to provide ready access to already-developed software and operating systems, it is preferred to use a commercially-available microprocessor chip, and any one of a number of devices may be chosen. The RISC (reduced instruction set) architecture has some advantage in implementing the loose synchronization as will be described, but more-conventional CISC (complex instruction set) microprocessors such as Motorola 68030 devices or Intel 80386 devices (available in 20-MHz and 25-MHz speeds) could be used. High-speed 32-bit RISC microprocessor devices are available from several sources in three basic types; Motorola produces a device as part number 88000, MIPS Computer Systems, Inc. and others produce a chip set referred to as the MIPS type, and Sun Microsystems has announced a so-called SPARC TM type (scalable processor architecture). Cypress Semiconductor of San Jose, Calif., for example, manufactures a microprocessor referred to as part number CY7C601 providing 20-MIPS (million instructions per second), clocked at 33-MHz, supporting the SPARC standard, and Fujitsu manufactures a CMOS RISC microprocessor, part number S-25, also supporting the SPARC standard.

The CPU board or module in the illustrative embodiment, used as an example, employs a microprocessor chip 40 which is in this case an R2000 device designed by MIPS Computer Systems, Inc., and also manufactured by Integrated Device Technology, Inc. The R2000 device is a 32-bit processor using RISC architecture to provide high performance, e.g., 12-MIPS at 16.67-MHz clock rate. Higher-speed versions of this device may be used instead, such as the R3000 that provides 20-MIPS at 25-MHz clock rate. The processor 40 also has a co-processor used for memory management, including a translation lookaside buffer to cache translations of logical to physical addresses. The processor 40 is coupled to a local bus having a data bus 41, an address bus 42 and a control bus 43. Separate instruction and data cache memories 44 and 45 are coupled to this local bus. These caches are each of 64K-byte size, for example, and are accessed within a single clock cycle of the processor 40. A numeric or floating point co-processor 46 is coupled to the local bus if additional performance is needed for these types of calculations; this numeric processor device is also commercially available from MIPS Computer Systems as part number R2010. The local bus 41, 42, 43, is coupled to an internal bus structure through a write buffer 50 and a read buffer 51. The write buffer is a commercially available device, part number R2020, and functions to allow the processor 40 to continue to execute Run cycles after storing data and address in the write buffer 50 for a write operation, rather than having to execute stall cycles while the write is completing.

In addition to the path through the write buffer 50, a path is provided to allow the processor 40 to execute write operations bypassing the write buffer 50. This path is a write buffer bypass 52 allows the processor, under software selection, to perform synchronous writes. If the write buffer bypass 52 is enabled (write buffer 50 not enabled) and the processor executes a write then the processor will stall until the write completes. In contrast, when writes are executed with the write buffer bypass 52 disabled the processor will not stall because data is written into the write buffer 50 (unless the write buffer is full). If the write buffer 50 is enabled when the processor 40 performs a write operation, the write buffer 50 captures the output data from bus 41 and the address from bus 42, as well as controls from bus 43. The write buffer 50 can hold up to four such data-address sets while it waits to pass the data on to the main memory. The write buffer runs synchronously with the clock 17 of the processor chip 40, so the processor-to-buffer transfers are synchronous and at the machine cycle rate of the processor. The write buffer 50 signals the processor if it is full and unable to accept data. Read operations by the processor 40 are checked against the addresses contained in the four-deep write buffer 50, so if a read is attempted to one of the data words waiting in the write buffer to be written to memory 16 or to global memory, the read is stalled until the write is completed.

The write and read buffers 50 and 51 are coupled to an internal bus structure having a data bus 53, an address bus 54 and a control bus 55. The local memory 16 is accessed by this internal bus, and a bus interface 56 coupled to the internal bus is used to access the system bus 21 (or bus 22 or 23 for the other CPUs). The separate data and address busses 53 and 54 of the internal bus (as derived from busses 41 and 42 of the local bus) are converted to a multiplexed address/data bus 57 in the system bus 21, and the command and control lines are correspondingly converted to command lines 58 and control lines 59 in this external bus.

The bus interface unit 56 also receives the acknowledge/status lines 33 from the memory modules 14 and 15. In these lines 33, separate status lines 33-1 or 33-2 are coupled from each of the modules 14 and 15, so the responses from both memory modules can be evaluated upon the event of a transfer (read or write) between CPUs and global memory, as will be explained.

The local memory 16, in one embodiment, comprises about 8-Mbyte of RAM which can be accessed in about three or four of the machine cycles of processor 40, and this access is synchronous with the clock 17 of this CPU, whereas the memory access time to the modules 14 and 15 is much greater than that to local memory, and this access to the memory modules 14 and 15 is asynchronous and subject to the synchronization overhead imposed by waiting for all CPUs to make the request then voting. For comparison, access to a typical commerically-available disk memory through the I/O processors 26, 27 and 29 is measured in milliseconds, i.e., considerably slower than access to the modules 14 and 15. Thus, there is a hierarchy of memory access by the CPU chip 40, the highest being the instruction and data caches 44 and 45 which will provide a hit ratio of perhaps 95% when using 64-KByte cache size and suitable fill algorithms. The second highest is the local memory 16, and again by employing contemporary virtual memory management algorithms a hit ratio of perhaps 95% is obtained for memory references for which a cache miss occurs but a hit in local memory 16 is found, in an example where the size of the local memory is about 8-MByte. The net result, from the standpoint of the processor chip 40, is that perhaps greater than 99% of memory references (but not I/O references) will be synchronous and will occur in either the same machine cycle or in three or four machine cycles.

The local memory 16 is accessed from the internal bus by a memory controller 60 which receives the addresses from address bus 54, and the address strobes from the control bus 55, and generates separate row and column addresses, and RAS and CAS controls, for example, if the local memory 16 employs DRAMs with multiplexed addressing, as is usually the case. Data is written to or read from the local memory via data bus 53. In addition, several local registers 61, as well as non-volatile memory 62 such as NVRAMs, and high-speed PROMs 63, as may be used by the operating system, are accessed by the internal bus; some of this part of the memory is used only at power-on, some is used by the operating system and may be almost continuously within the cache 44, and other may be within the non-cached part of the memory map.

External interrupts are applied to the processor 40 by one of the pins of the control bus 43 or 55 from an interrupt circuit 65 in the CPU module of FIG. 2. This type of interrupt is voted in the circuit 65, so that before an interrupt is executed by the processor 40 it is determined whether or not all three CPUs are presented with the interrupt; to this end, the circuit 65 receives interrupt pending inputs 66 from the other two CPUs 12 and 13, and sends an interrupt pending signal to the other two CPUs via line 67, these lines being part of the bus 18 connecting the three CPUs 11, 12 and 13 together. Also, for voting other types of interrupts, specifically CPU-generated interrupts, the circuit 65 can send an interrupt request from this CPU to both of the memory modules 14 and 15 by a line 68 in the bus 35, then receive separate voted-interrupt signals from the memory modules via lines 69 and 70; both memory modules will present the external interrupt to be acted upon. An interrupt generated in some external source such as a keyboard or disk drive on one of the I/O channels 28, for example, will not be presented to the interrupt pin of the chip 40 from the circuit 65 until each one of the CPUs 11, 12 and 13 is at the same point in the instruction stream, as will be explained.

Since the processors 40 are clocked by separate clock oscillators 17, there must be some mechanism for periodically bringing the processors 40 back into synchronization. Even though the clock oscillators 17 are of the same nominal frequency, e.g., 16.67-MHz, and the tolerance for these devices is about 25-ppm (parts per million), the processors can potentially become many cycles out of phase unless periodically brought back into synch. Of course, every time an external interrupt occurs the CPUs will be brought into synch in the sense of being interrupted at the same point in their instruction stream (due to the interrupt synch mechanism), but this does not help bring the cycle count into synch. The mechanism of voting memory references in the memory modules 14 and 15 will bring the CPUs into synch (in real time), as will be explained. However, some conditions result in long periods where no memory reference occurs, and so an additional mechanism is used to introduce stall cycles to bring the processors 40 back into synch. A cycle counter 71 is coupled to the clock 17 and the control pins of the processor 40 via control bus 43 to count machine cycles which are Run cycles (but not Stall cycles). This counter 71 includes a count register having a maximum count value selected to represent the period during which the maximum allowable drift between CPUs would occur (taking into account the specified tolerance for the crystal oscillators); when this count register overflows action is initiated to stall the faster processors until the slower processor or processors catch up. This counter 71 is reset whenever a synchronization is done by a memory reference to the memory modules 14 and 15. Also, a refresh counter 72 is employed to perform refresh cycles on the local memory 16, as will be explained. In addition, a counter 73 counts machine cycle which are Run cycles but not Stall cycles, like the counter 71 does, but this counter 73 is not reset by a memory reference; the counter 73 is used for interrupt synchronization as explained below, and to this end produces the output signals CC-4 and CC-8 to the interrupt synchronization circuit 65.

The processor 40 has a RISC instruction set which does not support memory-to-memory instructions, but instead only memory-to-register or register-to-memory instructions (i.e., load or store). It is important to keep frequently-used data and the currently-executing code in local memory. Accordingly, a block-transfer operation is provided by a DMA state machine 74 coupled to the bus interface 56. The processor 40 writes a word to a register in the DMA circuit 74 to function as a command, and writes the starting address and length of the block to registers in this circuit 74. In one embodiment, the microprocessor stalls while the DMA circuit takes over and executes the block transfer, producing the necessary addresses, commands and strobes on the busses 53-55 and 21. The command executed by the processor 40 to initiate this block transfer can be a read from a register in the DMA circuit 74. Since memory management in the Unix operating system relies upon demand paging, these block transfers will most often be pages being moved between global and local memory and I/O traffic. A page is 4-KBytes. Of course, the busses 21, 22 and 23 support single-word read and write transfers between CPUs and global memory; the block transfers referred to are only possible between local and global memory.

The Processor

Figure 3:
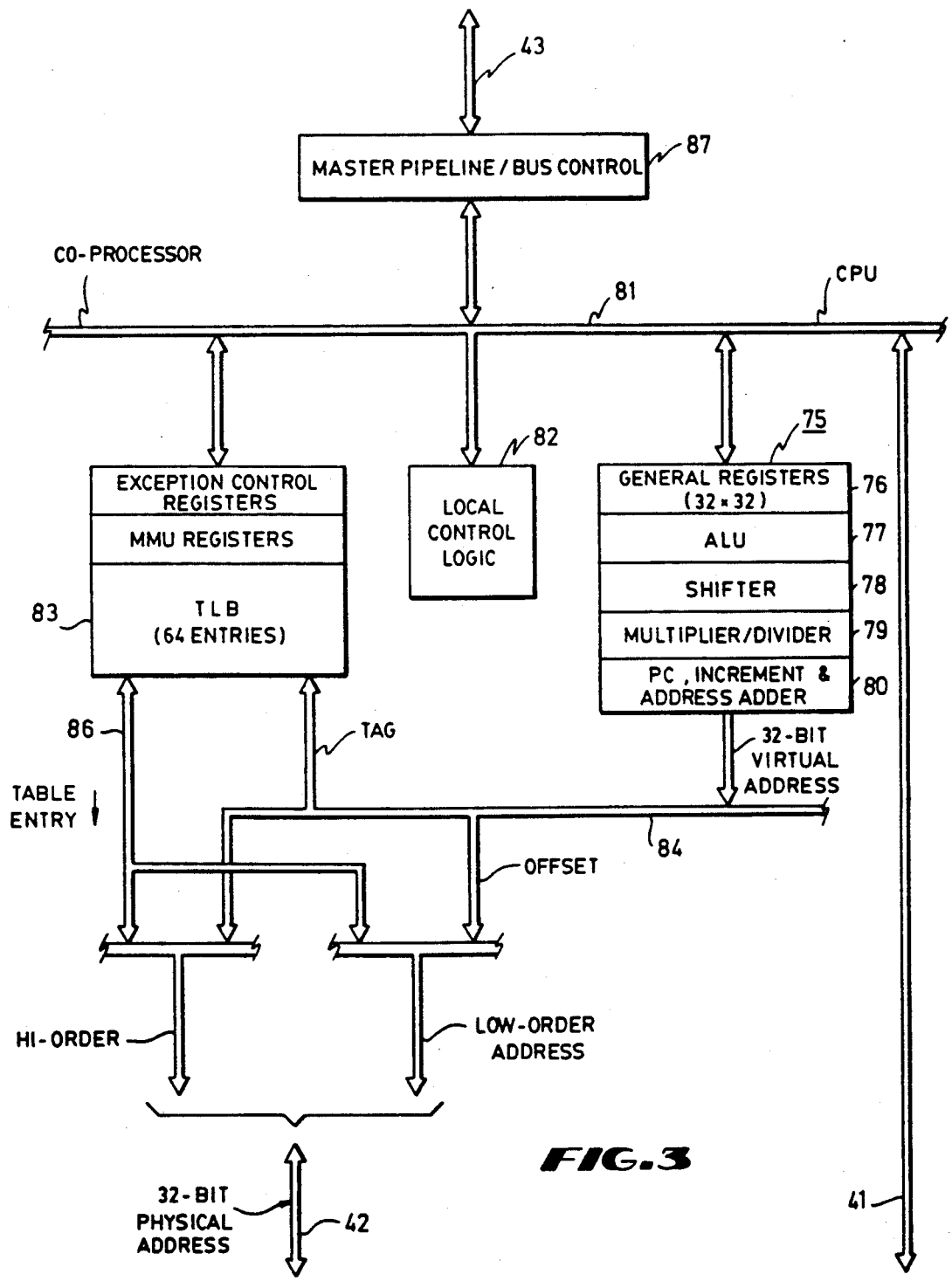
FIG. 3 is an electrical schematic diagram in block form of one of the microprocessor chip used in the CPU of FIG. 2.

Referring now to FIG. 3, the R2000 or R3000 type of microprocessor 40 of the example embodiment is shown in more detail. This device includes a main 32-bit CPU 75 containing thirty-two 32-bit general purpose registers 76, a 32-bit ALU 77, a zero-to-64 bit shifter 78, and a 32-by-32 multiply/divide circuit 79. This CPU also has a program counter 80 along with associated incrementer and adder. These components are coupled to a processor bus structure 81, which is coupled to the local data bus 41 and to an instruction decoder 82 with associated control logic to execute instructions fetched via data bus 41. The 32-bit local address bus 42 is driven by a virtual memory management arrangement including a translation lookaside buffer (TLB) 83 within an on-chip memory-management coprocessor. The TLB 83 contains sixty-four entries to be compared with a virtual address received from the microprocessor block 75 via virtual address bus 84. The low-order 16-bit part 85 of the bus 42 is driven by the low-order part of this virtual address bus 84, and the high-order part is from the bus 84 if the virtual address is used as the physical address, or is the tag entry from the TLB 83 via output 86 if virtual addressing is used and a hit occurs. The control lines 43 of the local bus are connected to pipeline and bus control circuitry 87, driven from the internal bus structure 81 and the control logic 82.

The microprocessor block 75 in the processor 40 is of the RISC type in that most instructions execute in one machine cycle, and the instruction set uses register-to-register and load/store instructions rather than having complex instructions involving memory references along with ALU operations. There are no complex addressing schemes included as part of the instruction set, such as "add the operand whose address is the sum of the contents of register A1 and register A2 to the operand whose address is found at the main memory location addressed by the contents of register B, and store the result in main memory at the location whose address is found in register C." Instead, this operation is done in a number of simple register-to-register and load/store instructions: add register A2 to register A1; load register B1 from memory location whose address is in register B; add register A1 and register B1; store register B1 to memory location addressed by register C. Optimizing compiler techniques are used to maximize the use of the thirty-two registers 76, i.e., assure that most operations will find the operands already in the register set. The load instructions actually take longer than one machine cycle, and to account for this a latency of one instruction is introduced; the data fetched by the load instruction is not used until the second cycle, and the intervening cycle is used for some other instruction, if possible.

Figure 4:
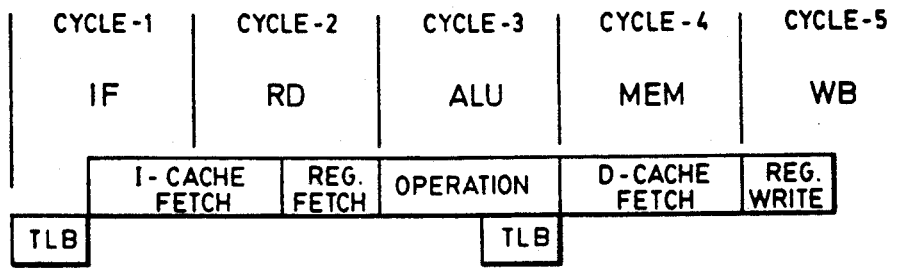
FIGS. 4 and 5 are timing diagrams showing events occurring in the CPU of FIGS. 2 and 3 as a function of time.
Figure 5:
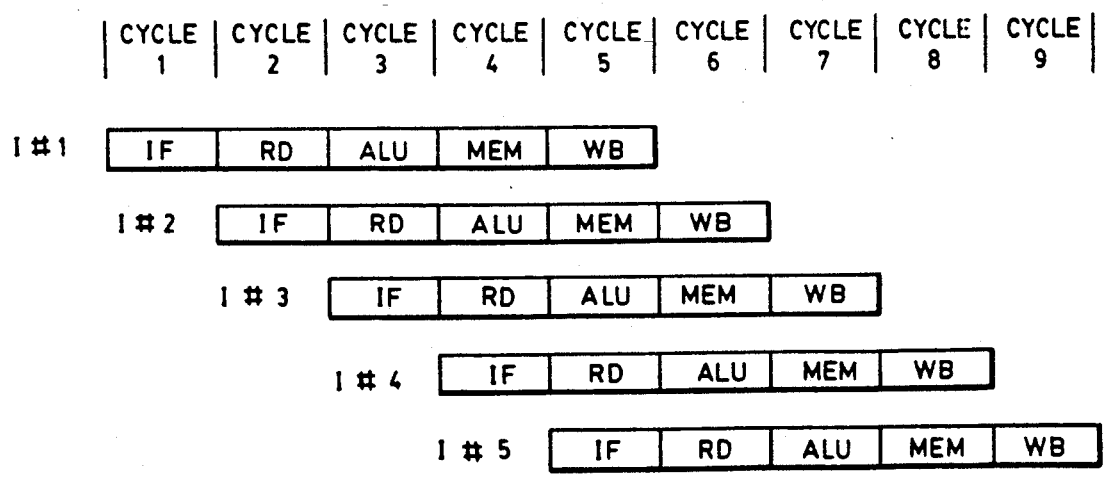

The main CPU 75 is highly pipelined to facilitate the goal of averaging one instruction execution per machine cycle. Referring to FIG. 4, a single instruction is executed over a period including five machine cycles, where a machine cycle is one clock period or 60-nsec for a 16.67-MHz clock 17. These five cycles or pipe stages are referred to as IF (instruction fetch from I-cache 44), RD (read operands from register set 76), ALU (perform the required operation in ALU 77), MEM (access D-cache 45 if required), and WB (write back ALU result to register file 76). As seen in FIG. 5, these five pipe stages are overlapped so that in a given machine cycle, cycle-5 for example, instruction I#5 is in its first or IF pipe stage and instruction I#1 is in its last or WB stage, while the other instructions are in the intervening pipe stages.

Memory Module

Figure 6:
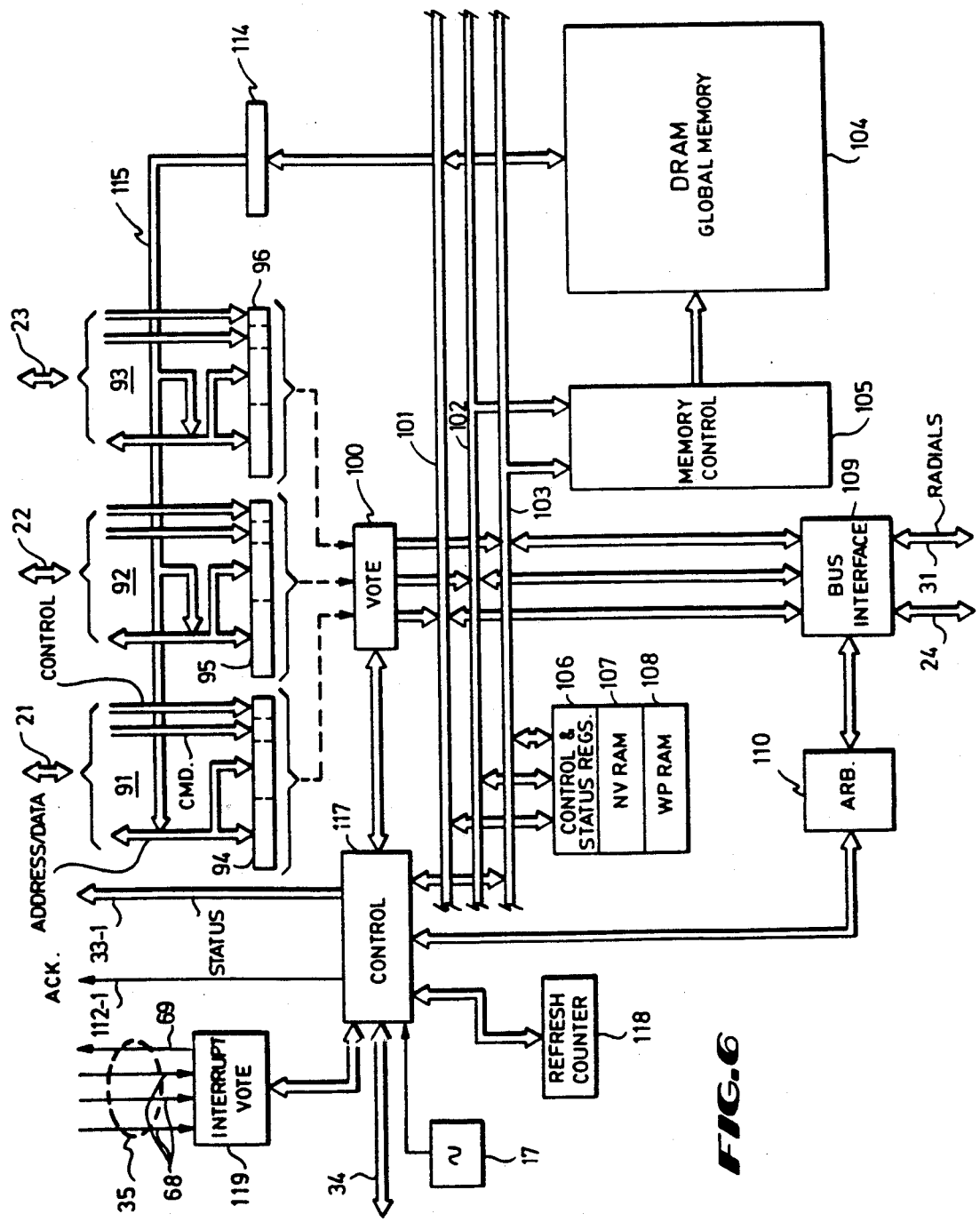
FIG. 6 is an electrical schematic diagram in block form of one of the memory modules in the computer system of FIG. 1.

With reference to FIG. 6, one of the memory modules 14 or 15 is shown in detail. Both memory modules are of the same construction in a preferred embodiment, so only the Memory#1 module is shown. The memory module includes three input/output ports 91, 92 and 93 coupled to the three busses 21, 22 and 23 coming from the CPUs 11, 12 and 13, respectively. Inputs to these ports are latched into registers 94, 95 and 96 each of which has separated sections to store data, address, command and strobes for a write operation, or address, command and strobes for a read operation. The contents of these three registers are voted by a vote circuit 100 having inputs connected to all sections of all three registers. If all three of the CPUs 11, 12 and 13 make the same memory request (same address, same command), as should be the case since the CPUs are typically executing the same instruction stream, then the memory request is allowed to complete; however, as soon as the first memory request is latched into any one of the three latches 94, 95 or 96, it is passed on immediately to begin the memory access. To this end, the address, data and command are applied to an internal bus including data bus 101, address bus 102 and control bus 103. From this internal bus the memory request accesses various resources, depending upon the address, and depending upon the system configuration.

In one embodiment, a large DRAM 104 is accessed by the internal bus, using a memory controller 105 which accepts the address from address bus 102 and memory request and strobes from control bus 103 to generate multiplexed row and column addresses for the DRAM so that data input/output is provided on the data bus 101. This DRAM 104 is also referred to as global memory, and is of a size of perhaps 32-MByte in one embodiment. In addition, the internal bus 101-103 can access control and status registers 106, a quantity of non-volatile RAM 107, and write-protect RAM 108. The memory reference by the CPUs can also bypass the memory in the memory module 14 or 15 and access the I/O busses 24 and 25 by a bus interface 109 which has inputs connected to the internal bus 101-103. If the memory module is the primary memory module, a bus arbitrator 110 in each memory module controls the bus interface 109. If a memory module is the backup module, the bus 34 controls the bus interface 109.

A memory access to the DRAM 104 is initiated as soon as the first request is latched into one of the latches 94, 95 or 96, but is not allowed to complete unless the vote circuit 100 determines that a plurality of the requests are the same, with provision for faults. The arrival of the first of the three requests causes the access to the DRAM 104 to begin. For a read, the DRAM 104 is addressed, the sense amplifiers are strobed, and the data output is produced at the DRAM outputs, so if the vote is good after the third request is received then the requested data is ready for immediate transfer back to the CPUs. In this manner, voting is overlapped with DRAM access.

Referring to FIG. 7, the busses 21, 22 and 23 apply memory requests to ports 91, 92 and 93 of the memory modules 14 and 15 in the format illustrated. Each of these busses consists of thirty-two bidirectional multiplexed address/data lines, thirteen unidirectional command lines, and two strobes. The command lines include a field which specifies the type of bus activity, such as read, write, block transfer, single transfer, I/O read or write, etc. Also, a field functions as a byte enable for the four bytes. The strobes are AS, address strobe, and DS, data strobe. The CPUs 11, 12 and 13 each control their own bus 21, 22 or 23; in this embodiment, these are not multi-master busses, there is no contention or arbitration. For a write, the CPU drives the address and command onto the bus in one cycle along with the address strobe AS (active low), then in a subsequent cycle (possibly the next cycle, but not necessarily) drives the data onto the address/data lines of the bus at the same time as a data strobe DS. The address strobe AS from each CPU causes the address and command then appearing at the ports 91, 92 or 93 to be latched into the address and command sections of the registers 94, 95 and 96, as these strobes appear, then the data strobe DS causes the data to be latched. When a plurality (two out of three in this embodiment) of the busses 21, 22 and 23 drive the same memory request into the latches 94, 95 and 96, the vote circuit 100 passes on the final command to the bus 103 and the memory access will be executed; if the command is a write, an acknowledge ACK signal is sent back to each CPU by a line 112 (specifically line 112-1 for Memory#1 and line 112-2 for Memory#2) as soon as the write has been executed, and at the same time status bits are driven via acknowledge/status bus 33 (specifically lines 33-1 for Memory#1 and lines 33-2 for Memory#2) to each CPU at time T3 of FIG. 7. The delay T4 between the last strobe DS (or AS if a read) and the ACK at T3 is variable, depending upon how many cycles out of synch the CPUs are at the time of the memory request, and depending upon the delay in the voting circuit and the phase of the internal independent clock 17 of the memory module 14 or 15 compared to the CPU clocks 17. If the memory request issued by the CPUs is a read, then the ACK signal on lines 112-1 and 112-2 and the status bits on lines 33-1 and 33-2 will be sent at the same time as the data is driven to the address/data bus, during time T3; this will release the stall in the CPUs and thus synchronize the CPU chips 40 on the same instruction. That is, the fastest CPU will have executed more stall cycles as it waited for the slower ones to catch up, then all three will be release at the same time, although the clocks 17 will probably be out of phase; the first instruction executed by all three CPUs when they come out of stall will be the same instruction.

All data being sent from the memory module 14 or 15 to the CPUs 11, 12 and 13, whether the data is read data from the DRAM 104 or from the memory locations 106-108, or is I/O data from the busses 24 and 25, goes through a register 114. This register is loaded from the internal data bus 101, and an output 115 from this register is applied to the address/data lines for busses 21, 22 and 23 at ports 91, 92 and 93 at time T3. Parity is checked when the data is loaded to this register 114. All data written to the DRAM 104, and all data on the I/O busses, has parity bits associated with it, but the parity bits are not transferred on busses 21, 22 and 23 to the CPU modules. Parity errors detected at the read register 114 are reported to the CPU via the status busses 33-1 and 33-. Only the memory module 14 or 15 designated as primary will drive the data in its register 114 onto the busses 21, 22 and 23. The memory module designated as back-up or secondary will complete a read operation all the way up to the point of loading the register 114 and checking parity, and will report status on buses 33-1 and 33-2, but no data will be driven to the busses 21, 22 and 23.

A controller 117 in each memory module 14 or 15 operates as a state machine clocked by the clock oscillator 17 for this module and receiving the various command lines from bus 103 and busses 21-23, etc., to generate control bits to load registers and busses, generate external control signals, and the like. This controller also is connected to the bus 34 between the memory modules 14 and 15 which transfers status and control information between the two. The controller 117 in the module 14 or 15 currently designated as primary will arbitrate via arbitrator 110 between the I/O side (interface 109) and the CPU side (ports 91-93) for access to the common bus 101-103. This decision made by the controller 117 in the primary memory module 14 or 15 is communicated to the controller 117 of other memory module by the lines 34, and forces the other memory module to execute the same access.

The controller 117 in each memory module also introduces refresh cycles for the DRAM 104, based upon a refresh counter 118 receiving pulses from the clock oscillator 17 for this module. The DRAM must receive 512 refresh cycles every 8-msec, so on average there must be a refresh cycle introduced about every 15-microsec. The counter 118 thus produces an overflow signal to the controller 117 every 15-microsec., and if an idle condition exists (no CPU access or I/O access executing) a refresh cycle is implemented by a command applied to the bus 103. If an operation is in progress, the refresh is executed when the current operation is finished. For lengthy operations such as block transfers used in memory paging, several refresh cycles may be backed up and execute in a burst mode after the transfer is completed; to this end, the number of overflows of counter 118 since the last refresh cycle are accumulated in a register associated with the counter 118.

Interrupt requests for CPU-generated interrupts are received from each CPU 11, 12 and 13 individually by lines 68 in the interrupt bus 35; these interrupt requests are sent to each memory module 14 and 15. These interrupt request lines 68 in bus 35 are applied to an interrupt vote circuit 119 which compares the three requests and produces a voted interrupt signal on outgoing line 69 of the bus 35. The CPUs each receive a voted interrupt signal on the two lines 69 and 70 (one from each module 14 and 15) via the bus 35. The voted interrupts from each memory module 14 and 15 are ORed and presented to the interrupt synchronizing circuit 65. The CPUs, under software control, decide which interrupts to service. External interrupts, generated in the I/O processors or I/O controllers, are also signalled to the CPUs through the memory modules 14 and 15 via lines 69 and 70 in bus 35, and likewise the CPUs only respond to an interrupt from the primary module 14 or 15.

I/O Processor

Figure 8:
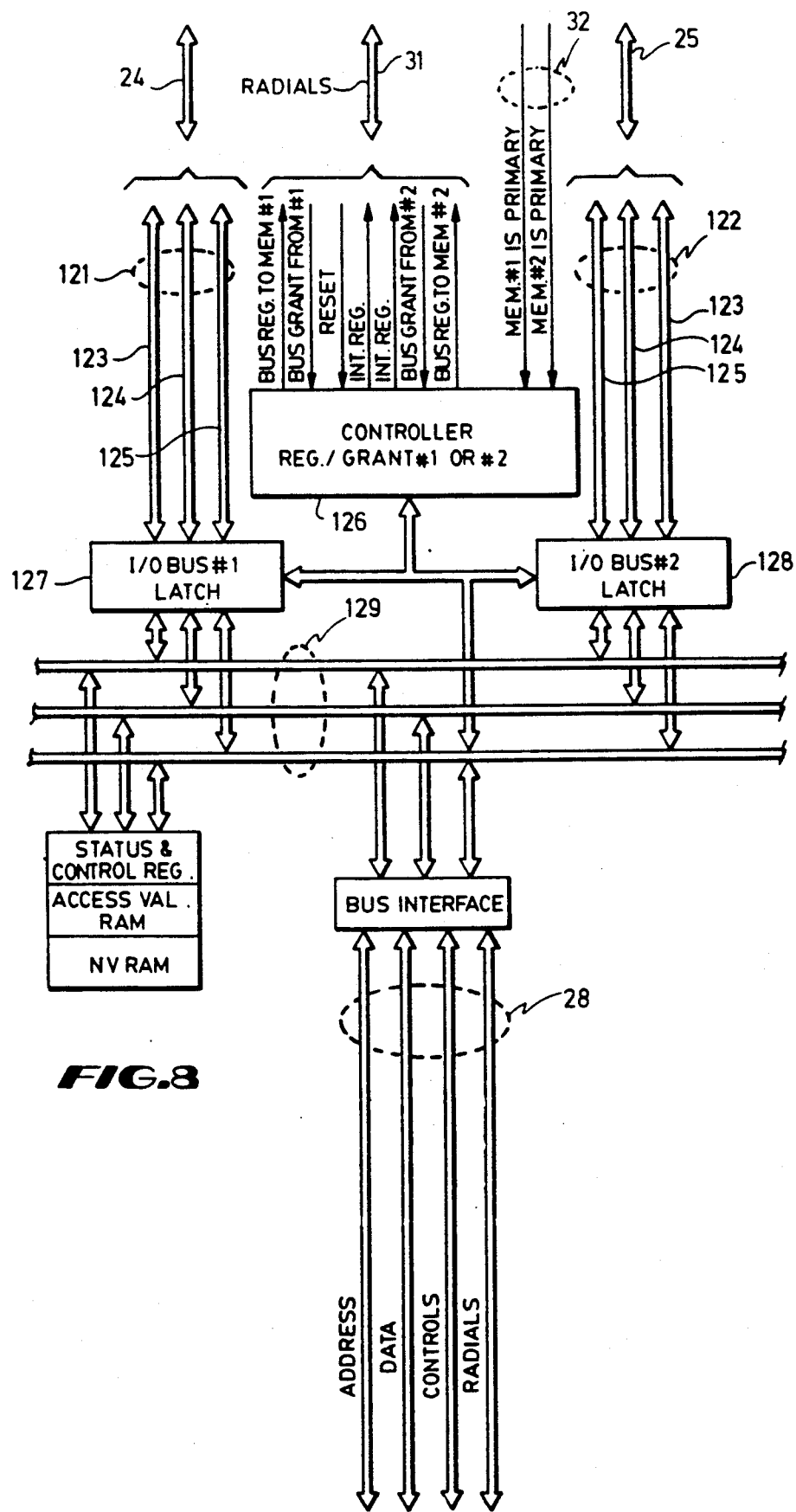
FIG. 8 is an electrical schematic diagram in block form of one of the I/O processors in the computer system of FIG. 1.

Referring now to FIG. 8, one of the I/O processors 26 or 27 is shown in detail. The I/O processor has two identical ports, one port 121 to the I/O bus 24 and the other port 122 to the I/O bus 25. Each one of the I/O busses 24 and 25 consists of: a 36-bit bidirectional multiplexed address/data bus 123 (containing 32-bits plus 4-bits parity), a bidirectional command bus 124 defining the read, write, block read, block write, etc. type of operation that is being executed, an address line that designates which location is being addressed, either internal to I/O processor or on busses 28, and the byte mask, and finally control lines 125 including address strobe, data strobe, address acknowledge and data acknowledge. The radial lines in bus 31 include individual lines from each I/O processor to each memory module: bus request from I/O processor to the memory modules, bus grant from the memory modules to the I/O processor, interrupt request lines from I/O processor to memory module, and a reset line from memory to I/O processor. Lines to indicate which memory module is primary are connected to each I/O processor via the system status bus 32. A controller or state machine 126 in the I/O processor of FIG. 8 receives the command, control, status and radial lines and internal data, and command lines from the busses 28, and defines the internal operation of the I/O processor, including operation of latches 127 and 128 which receive the contents of busses 24 and 25 and also hold information for transmitting onto the busses.

Transfer on the busses 24 and 25 from memory module to I/O processor uses a protocol as shown in FIG. 9 with the address and data separately acknowledged. The arbitrator circuit 110 in the memory module which is designated primary performs the arbitration for ownership of the I/O busses 24 and 25. When a transfer from CPUs to I/O is needed, the CPU request is presented to the arbitration logic 110 in the memory module. When the arbiter 110 grants this request the memory modules apply the address and command to busses 123 and 124 (of both busses 24 and 25) at the same time the address strobe is asserted on bus 125 (of both busses 24 and 25) in time T1 of FIG. 9; when the controller 126 has caused the address to be latched into latches 127 or 128, the address acknowledge is asserted on bus 125, then the memory modules place the data (via both busses 24 and 25) on the bus 123 and a data strobe on lines 125 in time T2, following which the controller causes the data to be latched into both latches 127 and 128 and a data acknowledge signal is placed upon the lines 125, so upon receipt of the data acknowledge, both of the memory modules release the bus 24, 25 by de-asserting the address strobe signal. The I/O processor then deasserts the address acknowledge signal.

For transfers from I/O processor to the memory module, when the I/O processor needs to use the I/O bus, it asserts a bus request by a line in the radial bus 31, to both busses 24 and 25, then waits for a bus grant signal from an arbitrator circuit 110 in the primary memory module 14 or 15, the bus grant line also being one of the radials. When the bus grant has been asserted, the controller 126 then waits until the address strobe and address acknowledge signal on busses 125 are deasserted (i.e., false) meaning the previous transfer is completed. At that time, the controller 126 causes the address to be applied from latches 127 and 128 to lines 123 of both busses 24 and 25, the command to be applied to lines 124, and the address strobe to be applied to the bus 125 of both busses 24 and 25. When address acknowledge is received from both busses 24 and 25, these are followed by applying the data to the address/data busses, along with data strobes, and the transfer is completed with a data acknowledge signals from the memory modules to the I/O processor.

Each one of the I/O controllers 30 on the VMEbuses 28 has connections to both I/O processors 26 and 27 and can be controlled by either one, but is bound to one or the other by the program executing in the CPUs. A particular address (or set of addresses) is established for control and data-transfer registers representing each controller 30, and these addresses are maintained in an I/O page table (normally in the kernel data section of local memory) by the operating system. These addresses associate each controller 30 as being accessible only through either I/O processor #1 or #2, but not both. Thus, when the device driver is called up to access this controller 30, the operating system uses these addresses to do it. The processors 40 access the controllers 30 by I/O writes to the control and data-transfer registers in these controllers using the write buffer bypass path 52, rather than through the write buffer 50, so these are synchronous writes, voted by circuits 100, passed through the memory modules to the busses 24 or 25, thus to the selected bus 28; the processors 40 stall until the write is completed. The I/O processor board of FIG. 8 is configured to detect certain failures, such as improper commands, time-outs where no response is received over VMEbus 28, parity-checked data if implemented, etc., and when one of these failures is detected the I/O processor quits responding to bus traffic, i.e., quits sending address acknowledge and data acknowledge as discussed above with reference to FIG. 9. This is detected by the bus interface 56 as a bus fault, resulting in an interrupt as will be explained, and self-correcting action if possible.

Error Recovery

The sequence used by the CPUs 11, 12 and 13 to evaluate responses by the memory modules 14 and 15 to transfers via busses 21, 22 and 23 will now be described. This sequence is defined by the state machine in the bus interface units 56 and in code executed by the CPUs.

In case one, for a read transfer, it is assumed that no data errors are indicated in the status bits on lines 33 from the primary memory. Here, the stall begun by the memory reference is ended by asserting a Ready signal via control bus 55 and 43 to allow instruction execution to continue in each microprocessor 40. But, another transfer is not started until acknowledge is received on line 112 from the other (non-primary) memory module (or it times out). An interrupt is posted if any error was detected in either status field (lines 33-1 or 33-2), or if the non-primary memory times out.

In case two, for a read transfer, it is assumed that a data error is indicated in the status lines 33 from the primary memory or that no response is received from the primary memory. The CPUs will wait for an acknowledge from the other memory, and if no data errors are found in status bits from the other memory, circuitry of the bus interface 56 forces a change in ownership (primary memory status), then a retry is instituted to see if data is correctly read from the new primary. If good status is received from the new primary, then the stall is ended as before, and an interrupt is posted to update the system (to note one memory bad and different memory is primary). However, if data error or timeout results from this attempt to read from the new primary, then an interrupt is asserted to the processor 40 via control bus 55 and 43.

For write transfers, with the write buffer 50 bypassed, case one is where no data errors are indicated in status bits 33-1 or 33-2 from the either memory module. The stall is ended to allow instruction execution to continue. Again, an interrupt is posted if any error was detected in either status field.

For write transfers, write buffer 50 bypassed, case two is where a data error is indicated in status from the primary memory, or no response is received from the primary memory. The interface controller of each CPU waits for an acknowledge from the other memory module, and if no data errors are found in the status from the other memory an ownership change is forced and an interrupt is posted. But if data errors or timeout occur for the other (new primary) memory module, then an interrupt is asserted to the processor 40.

For write transfers with the write buffer 50 enabled so the CPU chip is not stalled by a write operation, case one is with no errors indicated in status from either memory module. The transfer is ended, so another bus transfer can begin. But if any error is detected in either status field an interrupt is posted.

For write transfers, write buffer 50 enabled, case two is where a data error is indicated in status from the primary memory, or no response is received from the primary memory. The mechanism waits for an acknowledge from the other memory, and if no data error is found in the status from the other memory then an ownership change is forced and an interrupt is posted. But if data error or timeout occur for the other memory, then an interrupt is posted.

Once it has been determined by the mechanism just described that a memory module 14 or 15 is faulty, the fault condition is signalled to the operator, but the system can continue operating. The operator will probably wish to replace the memory board containing the faulty module, which can be done while the system is powered up and operating. The system is then able to re-integrate the new memory board without a shutdown. This mechanism also works to revive a memory module that failed to execute a write due to a soft error but then tested good so it need not be physically replaced. The task is to get the memory module back to a state where its data is identical to the other memory module. This revive mode is a two step process. First, it is assumed that the memory is uninitialized and may contain parity errors, so good data with good parity must be written into all locations, this could be all zeros at this point, but since all writes are executed on both memories the way this first step is accomplished is to read a location in the good memory module then write this data to the same location in both memory modules 14 and 15. This is done while ordinary operations are going on, interleaved with the task being performed. Writes originating from the I/O busses 24 or 25 are ignored by this revive routine in its first stage. After all locations have been thus written, the next step is the same as the first except that I/O accesses are also written; that is, I/O writes from the I/O busses 24 or 25 are executed as they occur in ordinary traffic in the executing task, interleaved with reading every location in the good memory and writing this same data to the same location in both memory modules. When the modules have been addressed from zero to maximum address in this second step, the memories are identical. During this second revive step, both CPUs and I/O processors expect the memory module being revived to perform all operations without errors. The I/O processors 26, 27 will not use data presented by the memory module being revived during data read transfers. After completing the revive process the revived memory can then be (if necessary) designated primary.

A similar revive process is provided for CPU modules. When one CPU is detected faulty (as by the memory voter 100, etc.) the other two continue to operate, and the bad CPU board can be replaced without system shutdown. When the new CPU board has run its power-on self-test routines from on-board ROM 63, it signals this to the other CPUs, and a revive routine is executed. First, the two good CPUs will copy their state to global memory, then all three CPUs will execute a "soft reset" whereby the CPUs reset and start executing from their initialization routines in ROM, so they will all come up at the exact same point in their instruction stream and will be synchronized, then the saved state is copied back into all three CPUs and the task previously executing is continued.

As noted above, the vote circuit 100 in each memory module determines whether or not all three CPUs make identical memory references. If so, the memory operation is allowed to proceed to completion. If not, a CPU fault mode is entered. The CPU which transmits a different memory reference, as detected at the vote circuit 100, is identified in the status returned on bus 33-1 and or 33-2. An interrupt is posted and a software subsequently puts the faulty CPU offline. This offline status is reflected on status bus 32. The memory reference where the fault was detected is allowed to complete based upon the two-out-of-three vote, then until the bad CPU board has been replaced the vote circuit 100 requires two identical memory requests from the two good CPUs before allowing a memory reference to proceed.

The system is ordinarily configured to continue operating with one CPU off-line, but not two. However, if it were desired to operate with only one good CPU, this is an alternative available. A CPU is voted faulty by the voter circuit 100 if different data is detected in its memory request, and also by a time-out; if two CPUs send identical memory requests, but the third does not send any signals for a preselected time-out period, that CPU is assumed to be faulty and is placed off-line as before.

The I/O arrangement of the system has a mechanism for software reintegration in the event of a failure. That is, the CPU and memory module core is hardware fault-protected as just described, but the I/O portion of the system is software fault-protected. When one of the I/O processors 26 or 27 fails, the controllers 30 bound to that I/O processor by software as mentioned above are switched over to the other I/O processor by software; the operating system rewrites the addresses in the I/O page table to use the new addresses for the same controllers, and from then on these controllers are bound to the other one of the pair of I/O processors 26 or 27. The error or fault can be detected by a bus error terminating a bus cycle at the bus interface 56, producing an exception dispatching into the kernel through an exception handler routine that will determine the cause of the exception, and then (by rewriting addresses in the I/O table) move all the controllers 30 from the failed I/O processor 26 or 27 to the other one.

Synchronization

The processors 40 used in the illustrative embodiment are of pipelined architecture with overlapped instruction execution, as discussed above with reference to FIGS. 4 and 5. Since a synchronization technique used in this embodiment relies upon cycle counting, i.e., incrementing a counter 71 and a counter 73 of FIG. 2 every time an instruction is executed, generally as set forth in application Ser. No. 118,503, there must be a definition of what constitutes the execution of an instruction in the processor 40. A straightforward definition is that every time the pipeline advances an instruction is executed. One of the control lines in the control bus 43 is a signal RUN# which indicates that the pipeline is stalled; when RUN# is high the pipeline is stalled, when RUN# is low (logic zero) the pipeline advances each machine cycle. This RUN# signal is used in the numeric processor 46 to monitor the pipeline of the processor 40 so this coprocessor 46 can run in lockstep with its associated processor 40. This RUN# signal in the control bus 43 along with the clock 17 are used by the counters 71 and 73 to count Run cycles.

The size of the counter register 71, in a preferred embodiment, is chosen to be 4096, i.e., $2^{12}$, which is selected because the tolerances of the crystal oscillators used in the clocks 17 are such that the drift in about 4K Run cycles on average results in a skew or difference in number of cycles run by a processor chip 40 of about all that can be reasonably allowed for proper operation of the interrupt synchronization as explained below. One synchronization mechanism is to force action to cause the CPUs to synchronize whenever the counter 71 overflows. One such action is to force a cache miss in response to an overflow signal OVFL from the counter 71; this can be done by merely generating a false Miss signal (e.g., TagValid bit not set) on control bus 43 for the next I-cache reference, thus forcing a cache miss exception routine to be entered and the resultant memory reference will produce synchronization just as any memory reference does. Another method of forcing synchronization upon overflow of counter 71 is by forcing a stall in the processor 40, which can be done by using the overflow signal OVFL to generate a CP Busy (coprocessor busy) signal on control bus 43 via logic circuit 71a of FIG. 2; this CP Busy signal always results in the processor 40 entering stall until CP Busy is deasserted. All three processors will enter this stall because they are executing the same code and will count the same cycles in their counter 71, but the actual time they enter the stall will vary; the logic circuit 71a receives the RUN# signal from bus 43 of the other two processors via input R#, so when all three have stalled the CP Busy signal is released and the processors will come out of stall in synch again.

Thus, two synchronization techniques have been described, the first being the synchronization resulting from voting the memory references in circuits 100 in the memory modules, and the second by the overflow of counter 71 as just set forth. In addition, interrupts are synchronized, as will be described below. It is important to note, however, that the processors 40 are basically running free at their own clock speed, and are substantially decoupled from one another, except when synchronizing events occur. The fact that microprocessors are used as illustrated in FIGS. 4 and 5 would make lock-step synchronization with a single clock more difficult, and would degrade performance; also, use of the write buffer 50 serves to decouple the processors, and would be much less effective with close coupling of the processors. Likewise, the high-performance resulting from using instruction and data caches, and virtual memory management with the TLBs 83, would be more difficult to implement if close coupling were used, and performance would suffer.

The interrupt synchronization technique must distinguish between real time and so-called "virtual time". Real time is the external actual time, clock-on-the-wall time, measured in seconds, or for convenience, measured in machine cycles which are 60-nsec divisions in the example. The clock generators 17 each produce clock pulses in real time, of course. Virtual time is the internal cycle-count time of each of the processor chips 40 as measured in each one of the cycle counters 71, and 73, i.e., the instruction number of the instruction being executed by the processor chip, measured in instructions since some arbitrary beginning point. Referring to FIG. 10, the relationship between real time, shown as $t_0$ to $t_{12}$, and virtual time, shown as instruction number (modulo-16 count in register 73) $I_0$ to $I_{15}$, is illustrated. Each row of FIG. 10 is the cycle count for one of the CPUs A, B or C, and each column is a "point" in real time. The clocks for the CPUs will most likely be out of phase, so the actual time correlation will be as seen in FIG. 10a, where the instruction numbers (columns) are not perfectly aligned, i.e., the cycle-count does not change on aligned real-time machine cycle boundaries; however, for explanatory purposes the illustration of FIG. 10 will suffice. In FIG. 10, at real time $t_3$ the CPU-A is at the third instruction, CPU-B is at count-9 or executing the ninth instruction, and CPU-C is at the fourth instruction. Note that both real time and virtual time can only advance.

The processor chip 40 in a CPU stalls under certain conditions when a resource is not available, such as a D-cache 45 or I-cache 44 miss during a load or an instruction fetch, or a signal that the write buffer 50 is full during a store operation, or a "CP Busy" signal via the control bus 43 that the coprocessor 46 is busy (the coprocessor receives an instruction it cannot yet handle due to data dependency or limited processing resources), or the multiplier/divider 79 is busy (the internal multiply/divide circuit has not completed an operation at the time the processor attempts to access the result register). Of these, the caches 44 and 45 are "passive resources" which do not change state without intervention by the processor 40, but the remainder of the items are active resources that can change state while the processor is not doing anything to act upon the resource. For example, the write buffer 50 can change from full to empty with no action by the processor (so long as the processor does not perform another store operation). So there are two types of stalls: stalls on passive resources and stalls on active resources. Stalls on active resources are called interlock stalls.

Since the code streams executing on the CPUs A, B and C are the same, the states of the passive resources such as caches 44 and 45 in the three CPUs are necessarily the same at every point in virtual time. If a stall is a result of a conflict at a passive resource (e.g., the data cache 45) then all three processors will perform a stall, and the only variable will be the length of the stall. Referring to FIG. 11, assume the cache miss occurs at $I_4$, and that the access to the global memory 14 or 15 resulting from the miss takes eight clocks (actually it may be more than eight). In this case, CPU-C begins the access to global memory 14 and 15 at $t_1$, and the controller 117 for global memory begins the memory access when the first processor CPU-C signals the beginning of the memory access. The controller 117 completes the access eight clocks later, at $t_8$, although CPU-A and CPU-B each stalled less than the eight clocks required for the memory access. The result is that the CPUs become synchronized in real time as well as in virtual time. This example also illustrates the advantage of overlapping the access to DRAM 104 and the voting in circuit 100.

Interlock stalls present a different situation from passive resource stalls. One CPU can perform an interlock stall when another CPU does not stall at all. Referring to FIG. 12, an interlock stall caused by the write buffer 50 is illustrated. The cycle-counts for CPU-A and CPU-B are shown, and the full flags $A_{wb}$ and $B_{wb}$ from write buffers 50 for CPU-A and CPU-B are shown below the cycle-counts (high or logic one means full, low or logic zero means empty). The CPU checks the state of the full flag every time a store operation is executed; if the full flag is set, the CPU stalls until the full flag is cleared then completes the store operation. The write buffer 50 sets the full flag if the store operation fills the buffer, and clears the full flag whenever a store operation drains one word from the buffer thereby freeing a location for the next CPU store operation. At time $t_0$ the CPU-B is three clocks ahead of CPU-A, and the write buffers are both full. Assume the write buffers are performing a write operation to global memory, so when this write completes during $t_5$ the write buffer full flags will be cleared; this clearing will occur synchronously in $t_6$ in real time (for the reason illustrated by FIG. 11) but not synchronously in virtual time. Now, assume the instruction at cycle-count $I_6$ is a store operation; CPU-A executes this store at $t_6$ after the write buffer full flag is cleared, but CPU-B tries to execute this store operation at $t_3$ and finds the write buffer full flag is still set and so has to stall for three clocks. Thus, CPU-B performs a stall that CPU-A did not.

The property that one CPU may stall and the other not stall imposes a restriction on the interpretation of the cycle counter 71. In FIG. 12, assume interrupts are presented to the CPUs on a cycle count of $I_7$ (while the CPU-B is stalling from the $I_6$ instruction). The run cycle for cycle count $I_7$ occurs for both CPUs at $t_7$. If the cycle counter alone presents the interrupt to the CPU, then CPU-A would see the interrupt on cycle count $I_7$ but CPU-B would see the interrupt during a stall cycle resulting from cycle count $I_6$, so this method of presenting interrupts would cause the two CPUs to take an exception on different instructions, a condition that would not have occurred if either all of the CPUs stalled or none stalled.

Another restriction on the interpretation of the cycle counter is that there should not be any delays between detecting the cycle count and performing an action. Again referring to FIG. 12, assume interrupts are presented to the CPUs on cycle count $I_6$, but because of implementation restrictions an extra clock delay is interposed between detection of cycle count $I_6$ and presentation of the interrupt to the CPU. The result is that CPU-A sees this interrupt on cycle count $I_7$, but CPU-B will see the interrupt during the stall from cycle count $I_6$, causing the two CPUs to take an exception on different instructions. Again, the importance of monitoring the state of the instruction pipeline in real time is illustrated.

Interrupt Synchronization

The three CPUs of the system of FIGS. 1-3 are required to function as a single logical processor, thus requiring that the CPUs adhere to certain restrictions regarding their internal state to ensure that the programming model of the three CPUs is that of a single logical processor. Except in failure modes and in diagnostic functions, the instruction streams of the three CPUs are required to be identical. If not identical, then voting global memory accesses at voting circuitry 100 of FIG. 6 would be difficult; the voter would not know whether one CPU was faulty or whether it was executing a different sequence of instructions. The synchronization scheme is designed so that if the code stream of any CPU diverges from the code stream of the other CPUs, then a failure is assumed to have occurred. Interrupt synchronization provides one of the mechanisms of maintaining a single CPU image.

All interrupts are required to occur synchronous to virtual time, ensuring that the instruction streams of the three processors CPU-A, CPU-B and CPU-C will not diverge as a result of interrupts (there are other causes of divergent instruction streams, such as one processor reading different data than the data read by the other processors). Several scenarios exist whereby interrupts occurring asynchronous to virtual time would cause the code streams to diverge. For example, an interrupt causing a context switch on one CPU before process A completes, but causing the context switch after process A completes on another CPU would result in a situation where, at some point later, one CPU continues executing process A, but the other CPU cannot execute process A because that process had already completed. If in this case the interrupts occurred asynchronous to virtual time, then just the fact that the exception program counters were different could cause problems. The act of writing the exception program counters to global memory would result in the voter detecting different data from the three CPUs, producing a vote fault.

Certain types of exceptions in the CPUs are inherently synchronous to virtual time. One example is a breakpoint exception caused by the execution of a breakpoint instruction. Since the instruction streams of the CPUs are identical, the breakpoint exception occurs at the same point in virtual time on all three of the CPUs. Similarly, all such internal exceptions inherently occur synchronous to virtual time. For example, TLB exceptions are internal exceptions that are inherently synchronous. TLB exceptions occur because the virtual page number does not match any of the entries in the TLB 83. Because the act of translating addresses is solely a function of the instruction stream (exactly as in the case of the breakpoint exception), the translation is inherently synchronous to virtual time. In order to ensure that TLB exceptions are synchronous to virtual time, the state of the TLBs 83 must be identical in all three of the CPUs 11, 12 and 13, and this is guaranteed because the TLB 83 can only be modified by software. Again, since all of the CPUs execute the same instruction stream, the state of the TLBs 83 are always changed synchronous to virtual time. So, as a general rule of thumb, if an action is performed by software then the action is synchronous to virtual time. If an action is performed by hardware, which does not use the cycle counters 71, then the action is generally synchronous to real time.

External exceptions are not inherently synchronous to virtual time. I/O devices 26, 27 or 30 have no information about the virtual time of the three CPUs 11, 12 and 13. Therefore, all interrupts that are generated by these I/O devices must be synchronized to virtual time before presenting to the CPUs, as explained below. Floating point exceptions are different from I/O device interrupts because the floating point coprocessor 46 is tightly coupled to the microprocessor 40 within the CPU.

External devices view the three CPUs as one logical processor, and have no information about the synchronaity or lack of synchronaity between the CPUs, so the external devices cannot produce interrupts that are synchronous with the individual instruction stream (virtual time) of each CPU. Without any sort of synchronization, if some external device drove an interrupt at time real time $t_1$ of FIG. 10, and the interrupt was presented directly to the CPUs at this time then the three CPUs would take an exception trap at different instructions, resulting in an unacceptable state of the three CPUs. This is an example of an event (assertion of an interrupt) which is synchronous to real time but not synchronous to virtual time.

Interrupts are synchronized to virtual time in the system of FIGS. 1-3 by performing a distributed vote on the interrupts and then presenting the interrupt to the processor on a predetermined cycle count. FIG. 13 shows a more detailed block diagram of the interrupt synchronization logic 65 of FIG. 2. Each CPU contains a distributor 135 which captures the external interrupt from the line 69 or 70 coming from the modules 14 or 15; this capture occurs on a predetermined cycle count, e.g., at count-4 as signalled on an input line CC-4 from the counter 71. The captured interrupt is distributed to the other two CPUs via the inter-CPU bus 18. These distributed interrupts are called pending interrupts. There are three pending interrupts, one from each CPU 11, 12 and 13. A voter circuit 136 captures the pending interrupts and performs a vote to verify that all of the CPUs did receive the external interrupt request. On a predetermined cycle count (detected from the cycle counter 71), in this example cycle-8 received by input line CC-8, the interrupt voter 136 presents the interrupt to the interrupt pin on its respective microprocessor 40 via line 137 and control bus 55 and 43. Since the cycle count that is used to present the interrupt is predetermined, all of the microprocessors 40 will receive the interrupt on the same cycle count and thus the interrupt will have been synchronized to virtual time.

FIG. 14 shows the sequence of events for synchronizing interrupts to virtual time. The rows labeled CPU-A, CPU-B, and CPU-C indicate the cycle count in counter 71 of each CPU at a point in real time. The rows labeled IRQ_A_PEND, IRQ_B_PEND, and IRQ_C_PEND indicate the state of the interrupt pending bits coupled via the inter-CPU bus 18 to the input of the voters 136 (a one signifies that the pending bit is set). The rows labeled IRQ_A, IRQ_B, and IRQ_C indicate the state of the interrupt input pin on the microprocessor 40 (the signals on lines 137), where a one signifies that an interrupt is present at the input pin. In FIG. 14, the external interrupt (EX_IRQ) is asserted on line 69 at $t_0$. If the interrupt distributor 135 captures and then distributes the interrupt to the inter-CPU bus 18 on cycle count 4, then IRQ_C_PEND will go active at $t_1$, IRQ_B_PEND will go active at $t_2$, and IRQ_A_PEND will go active at $t_4$. If the interrupt voter 136 captures and then votes the interrupt pending bits on cycle count 8, then IRQ_C will go active at $t_5$, IRQ_B will go active at $t_6$, and IRQ-A will go active at $t_8$. The result is that the interrupts were presented to the CPUs at different points in real time but at the same point in virtual time (i.e. cycle count 8).

FIG. 15 illustrates a scenario which requires the algorithm presented in FIG. 14 to be modified. Note that the cycle counter 71 is here represented by a modulo 8 counter. The external interrupt (EX_IRQ) is asserted at time $t_3$, and the interrupt distributor 135 captures and then distributes the interrupt to the inter-CPU bus 18 on cycle count 4. Since CPU-B and CPU-C have executed cycle count 4 before time $t_3$, their interrupt distributor does not capture the external interrupt. CPU-A, however, executes cycle count 4 after time $t_3$. The result is that CPU-A captures and distributes the external interrupt at time $t_4$. But if the interrupt voter 136 captures and votes the interrupt pending bits on cycle 7, the interrupt voter on CPU-A captures the IRQ_A_PEND signal at time $t_7$, when the two other interrupt pending bits are not set. The interrupt voter 136 on CPU-A recognizes that not all of the CPUs have distributed the external interrupt and thus places the captured interrupt pending bit in a holding register 138. The interrupt voters 136 on CPU-B and CPU-C capture the single interrupt pending bit at times $t_5$ and $t_4$ respectively. Like the interrupt voter on CPU-A, the voters recognize that not all of the interrupt pending bits are set, and thus the single interrupt pending bit that is set is placed into the holding register 138. When the cycle counter 71 on each CPU reaches a cycle count of 7, the counter rolls over and begins counting at cycle count 0. Since the external interrupt is still asserted, the interrupt distributor 135 on CPU-B and CPU-C will capture the external interrupt at times $t_{10}$ and $t_9$ respectively. These times correspond to when the cycle count becomes equal to 4. At time $t_{12}$, the interrupt voter on CPU-C captures the interrupt pending bits on the inter-CPU bus 18. The voter 136 determines that all of the CPUs did capture and distribute the external interrupt and thus presents the interrupt to the processor chip 40. At times $t_{13}3$ and $t_{15}$, the interrupt voters 136 on CPU-B and CPU-A capture the interrupt pending bits and then presents the interrupt to the processor chip 40. The result is that all of the processor chips received the external interrupt request at identical instructions, and the information saved in the holding registers is not needed.

Holding Register

In the interrupt scenario presented above with reference to FIG. 15, the voter 136 uses a holding register 138 to save some state information. In particular, the saved state was that some, but not all, of the CPUs captured and distributed an external interrupt. If the system does not have any faults (as was the situation in FIG. 15) then this state information is not necessary because, as shown in the previous example, external interrupts can be synchronized to virtual time without the use of the holding register 138. The algorithm is that the interrupt voter 136 captures and votes the interrupt pending bits on a predetermined cycle count. When all of the interrupt pending bits are asserted, then the interrupt is presented to the processor chip 40 on the predetermined cycle count. In the example of FIG. 15, the interrupts were voted on cycle count 7.

Referring to FIG. 15, if CPU-C fails and the failure mode is such that the interrupt distributor 135 does not function correctly, then if the interrupt voters 136 waited until all of the interrupt pending bits were set before presenting the interrupt to the processor chip 40, the result would be that the interrupt would never get presented. Thus, a single fault on a single CPU renders the entire interrupt chain on all of the CPUs inoperable.

The holding register 138 provides a mechanism for the voter 136 to know that the last interrupt vote cycle captured at least one, but not all, of the interrupt pending bits. The interrupt vote cycle occurs on the cycle count that the interrupt voter captures and votes the interrupt pending bits. There are only two scenarios that result in some of the interrupt pending bits being set. One is the scenario presented in reference to FIG. 15 in which the external interrupt is asserted before the interrupt distribution cycle on some of the CPUs but after the interrupt distribution cycle on other CPUs. In the second scenario, at least one of the CPUs fails in a manner that disables the interrupt distributor. If the reason that only some of the interrupt pending bits are set at the interrupt vote cycle is case one scenario, then the interrupt voter is guaranteed that all of the interrupt pending bits will be set on the next interrupt vote cycle. Therefore, if the interrupt voter discovers that the holding register has been set and not all of the interrupt pending bits are set, then an error must exist on one or more of the CPUs. This assumes that the holding register 138 of each CPU gets cleared when an interrupt is serviced, so that the state of the holding register does not represent stale state on the interrupt pending bits. In the case of an error, the interrupt voter 136 can present the interrupt to the processor chip 40 and simultaneously indicate that an error has been detected in the interrupt synchronization logic.

The interrupt voter 136 does not actually do any voting but instead merely checks the state of the interrupt pending bits and the holding register 137 to determine whether or not to present an interrupt to the processor chip 40 and whether or not to indicate an error in the interrupt logic.

Modulo Cycle Counters

The interrupt synchronization example of FIG. 15 represented the interrupt cycle counter 71 as a modulo N counter (e.g., a modulo 8 counter). Using a modulo N cycle counter simplified the description of the interrupt voting algorithm by allowing the concept of an interrupt vote cycle. With a modulo N cycle counter, the interrupt vote cycle can be described as a single cycle count which lies between 0 and N−1 where N is the modulo of the cycle counter. Whatever value of cycle counter is chosen for the interrupt vote cycle, that cycle count is guaranteed to occur every N cycle counts; as illustrated in FIG. 15 for a modulo 8 counter, every eight counts an interrupt vote cycle occurs. The interrupt vote cycle is used here merely to illustrate the periodic nature of a modulo N cycle counter. Any event that is keyed to a particular cycle count of a modulo N cycle counter is guaranteed to occur every N cycle counts. Obviously, an infinite (i.e., non-repeating counter 71) couldn't be used.

A value of N is chosen to maximize system parameters that have a positive effect on the system and to minimize system parameters that have a negative effect on the system. Some of such effects are developed empirically. First, some of the parameters will be described; $C_v$ and $C_d$ are the interrupt vote cycle and the interrupt distribution cycle respectively (in the circuit of FIG. 13 these are the inputs CC-8 and CC-4, respectively). The value of $C_v$ and $C_d$ must lie in the range between 0 and N−1 where N is the modulo of the cycle counter. $D_{max}$ is the maximum amount of cycle count drift between the three processors CPU-A, -B and -C that can be tolerated by the synchronization logic. The processor drift is determined by taking a snapshot of the cycle counter 71 from each CPU at a point in real time. The drift is calculated by subtracting the cycle count of the slowest CPU from the cycle count of the fastest CPU, performed as modulo N subtraction. The value of $D_{max}$ is described as a function of N and the values of $C_v$ and $C_d$.

First, $D_{max}$ will be defined as a function of the difference Cv-Cd, where the subtraction operation is performed as modulo N subtraction. This allows us to choose values of $C_v$ and $C_d$ that maximize $D_{max}$. Consider the scenario in FIG. 16. Suppose that $C_d=8$ and $C_v=9$. From FIG. 16 the processor drift can be calculated to be $D_{max}=4$. The external interrupt on line 69 is asserted at time $t_4$. In this case, CPU-B will capture and distribute the interrupt at time $t_5$. CPU-B will then capture and vote the interrupt pending bits at time $t_6$. This scenario is inconsistent with the interrupt synchronization algorithm presented earlier because CPU-B executes its interrupt vote cycle before CPU-A has performed the interrupt distribution cycle. The flaw with this scenario is that the processors have drifted further apart than the difference between $C_v$ and $C_d$. The relationship can be formally written as $$C_v - C_d < D_{max} - e \tag{1}$$

where e is the time needed for the interrupt pending bits to propagate on the inter-CPU bus 18. In previous examples, e has been assumed to be zero. Since wall-clock time has been quantized in clock cycle (Run cycle) increments, e can also be quantized. Thus the equation becomes $$C_v - C_d < D_{max} - 1 \tag{2}$$

where $D_{max}$ is expressed as an integer number of cycle counts.

Next, the maximum drift can be described as a function of N. FIG. 17 illustrates a scenario in which N=4 and the processor drift D=3. Suppose that $C_d=0$. The subscripts on cycle count O of each processor denote the quotient part (Q) of the instruction cycle count. Since the cycle count is now represented in modulo N, the value of the cycle counter is the remainder portion of I/N where I is the number of instructions that have been executed since time $t_0$. The Q of the instruction cycle count is the integer portion of I/N. If the external interrupt is asserted at time $t_3$, then CPU-A will capture and distribute the interrupt at time $t_4$, and CPU-B will execute its interrupt distribution cycle at time $t_5$. This presents a problem because the interrupt distribution cycle for CPU-A has Q=1 and the interrupt distribution cycle for CPU-B has Q=2. The synchronization logic will continue as if there are no problems and will thus present the interrupt to the processors on equal cycle counts. But the interrupt will be presented to the processors on different instructions because the Q of each processor is different. The relationship of $D_{max}$ as a function of N is therefore $$N/2 > D_{max} \tag{3}$$

where N is an even number and Dmax is expressed as an integer number of cycle counts. (These equations 2 and 3 can be shown to be both equivalent to the Nyquist theorem in sampling theory.) Combining equations 2 and 3 gives $$C_v - C_d < N/2 - 1 \tag{4}$$

which allows optimum values of Cv and Cd to be chosen for a given value of N.

All of the above equations suggest that N should be as large as possible. The only factor that tries to drive N to a small number is interrupt latency. Interrupt latency is the time interval between the assertion of the external interrupt on line 69 and the presentation of the interrupt to the microprocessor chip on line 137. Which processor should be used to determine the interrupt latency is not a clear-cut choice. The three microprocessors will operate at different speeds because of the slight differences in the crystal oscillators in clock sources 17 and other factors. There will be a fastest processor, a slowest processor, and the other processor. Defining the interrupt latency with respect to the slowest processor is reasonable because the performance of system is ultimately determined by the performance of the slowest processor. The maximum interrupt latency is $$L_{max} = 2N - 1 \tag{5}$$

where $L_{max}$ is the maximum interrupt latency expressed in cycle counts. The maximum interrupt latency occurs when the external interrupt is asserted after the interrupt distribution cycle $C_d$ of the fastest processor but before the interrupt distribution cycle $C_d$ of the slowest processor. The calculation of the average interrupt latency $L_{ave}$ is more complicated because it depends on the probability that the external interrupt occurs after the interrupt distribution cycle of the fastest processor and before the interrupt distribution cycle of the slowest processor. This probability depends on the drift between the processors which in turn is determined by a number of external factors. If we assume that these probabilities are zero, then the average latency may be expressed as $$L_{ave} = N/2 + (C_v - C_d) \tag{6}$$

Using these relationships, values of N, $C_v$, and $C_d$ are chosen using the system requirements for $D_{max}$ and interrupt latency. For example, choosing N=128 and $(C_v - C_d) = 10$, $L_{ave} = 74$ or about 4.4 microsec (with no stall cycles). Using the preferred embodiment where a four bit (four binary stage) counter 71a is used as the interrupt synch counter, and the distribute and vote outputs are at CC-4 and CC-8 as discussed, it is seen that N=16, $C_v=8$ and $C_d=4$, so $L_{ave} = 16/2 + (8-4) = 12$-cycles or 0.7 microsec.

Refresh Control for Local Memory

The refresh counter 72 counts non-stall cycles (not machine cycles) just as the counters 71 and 71a count. The object is that the refresh cycles will be introduced for each CPU at the same cycle count, measured in virtual time rather than real time. Preferably, each one of the CPUs will interpose a refresh cycle at the same point in the instruction stream as the other two. The DRAMs in local memory 16 must be refreshed on a 512 cycles per 8-msec. schedule just as mentioned above regarding the DRAMs 104 of the global memory. Thus, the counter 72 could issue a refresh command to the DRAMs 16 once every 15-microsec., addressing one row of 512, so the refresh specification would be satisfied; if a memory operation was requested during refresh then a Busy response would result until refresh was finished. But letting each CPU handle its own local memory refresh in real time independently of the others could cause the CPUs to get out of synch, and so additional control is needed. For example, if refresh mode is entered just as a divide operation is beginning, then timing is such that one CPU could take two clocks longer than others. Or, if a non-interruptable sequence was entered by a faster CPU then the others went into refresh before entering this routine, the CPUs could walk away from one another. However, using the cycle counter 71 (instead of real time) to avoid some of these problems means that stall cycles are not counted, and if a loop is entered causing many stalls (some can cause a 7-to-1 stall-to-run ratio) then the refresh specification is not met unless the period is decreased substantially from the 15-microsec figure, but that would degrade performance. For this reason, stall cycles are also counted in a second counter 72a, seen in FIG. 2, and every time this counter reaches the same number as that counted in the refresh counter 72, an additional refresh cycle is introduced. For example, the refresh counter 72 counts $2^8$ or 256 Run cycles, in step with the counter 71, and when it overflows a refresh is signalled via control bus 43. Meanwhile, counter 72a counts $2^8$ stall cycles (responsive to the RUN# signal and clock 17), and every time it overflows a second counter 72b is incremented (counter 72b may be merely bits 9-to-11 for the eight-bit counter 72a), so when a refresh mode is finally entered the CPU does a number of additional refreshes indicated by the number in the counter register 72b. Thus, if a long period of stall-intensive execution is encountered, the average number of refreshes will stay in the one per 15-microsec range, even if up to $7 \times 256$ stall cycles are interposed, because when finally going into a refresh mode the number of rows refreshed will catch up to the nominal refresh rate, yet there is no degradation of performance by arbitrarily shortening the refresh cycle.

Memory Management

The CPUs 11, 12 and 13 of FIGS. 1-3 have memory space organized as illustrated in FIG. 18. Using the example that the local memory 16 is 8-MByte and the global memory 14 or 15 is 32-MByte, note that the local memory 16 is part of the same continuous zero-to-40M map of CPU memory access space, rather than being a cache or a separate memory space; realizing that the 0-8M section is triplicated (in the three CPU modules), and the 8-40M section is duplicated, nevertheless logically there is merely a single 0-40M physical address space. An address over 8-MByte on bus 54 causes the bus interface 56 to make a request to the memory modules 14 and 15, but an address under 8-MByte will access the local memory 16 within the CPU module itself. Performance is improved by placing more of the memory used by the applications being executed in local memory 16, and so as memory chips are available in higher densities at lower cost and higher speeds, additional local memory will be added, as well as additional global memory. For example, the local memory might be 32-MByte and the global memory 128-MByte. On the other hand, if a very minimum-cost system is needed, and performance is not a major determining factor, the system can be operated with no local memory, all main memory being in the global memory area (in memory modules 14 and 15), although the performance penalty is high for such a configuration.

The content of local memory portion 141 of the map of FIG. 18 is identical in the three CPUs 11, 12 and 13. Likewise, the two memory modules 14 and 15 contain identically the same data in their space 142 at any given instant. Within the local memory portion 141 is stored the kernel 143 (code) for the Unix operating system, and this area is physically mapped within a fixed portion of the local memory 16 of each CPU. Likewise, kernel data is assigned a fixed area 144 in each local memory 16; except upon boot-up, these blocks do not get swapped to or from global memory or disk. Another portion 145 of local memory 16 is employed for user program (and data) pages, which are swapped to area 146 of the global memory 14 and 15 under control of the operating system. The global memory area 142 is used as a staging area for user pages in area 146, and also as a disk buffer in an area 147; if the CPUs are executing code which performs a write of a block of data or code from local memory 16 to disk 148, then the sequence is to always write to a disk buffer area 147 instead because the time to copy to area 147 is negligible compared to the time to copy directly to the I/O processor 26 and 27 and thus via I/O controller 30 to disk 148. Then, while the CPUs proceed to execute other code, the write-to-disk operation is done, transparent to the CPUs, to move the block from area 147 to disk 148. In a like manner, the global memory area 146 is mapped to include an I/O staging 149 area, for similar treatment of I/O accesses other than disk (e.g., video).

The physical memory map of FIG. 18 is correlated with the virtual memory management system of the processor 40 in each CPU. FIG. 19 illustrates the virtual address map of the R2000 processor chip used in the example embodiment, although it is understood that other microprocessor chips supporting virtual memory management with paging and a protection mechanism would provide corresponding features.

In FIG. 19, two separate 2-GByte virtual address spaces 150 and 151 are illustrated; the processor 40 operates in one of two modes, user mode and kernel mode. The processor can only access the area 150 in the user mode, or can access both the areas 150 and 151 in the kernel mode. The kernel mode is analogous to the supervisory mode provided in many machines. The processor 40 is configured to operate normally in the user mode until an exception is detected forcing it into the kernel mode, where it remains until a restore from exception (RFE) instruction is executed. The manner in which the memory addresses are translated or mapped depends upon the operating mode of the microprocessor, which is defined by a bit in a status register. When in the user mode, a single, uniform virtual address space 150 referred to as "kuseg" of 2-GByte size is available. Each virtual address is also extended with a 6-bit process identifier (PID) field to form unique virtual addresses for up to sixty-four user processes. All references to this segment 150 in user mode are mapped through the TLB 83, and use of the caches 144 and 145 is determined by bit settings for each page entry in the TLB entries; i.e., some pages may be cachable and some not as specified by the programmer.

When in the kernel mode, the virtual address space includes both the areas 150 and 151 of FIG. 19, and this space has four separate segments kuseg 150, kseg0 152, kseg1 153 and kseg2 154. The kuseg 150 segment for the kernel mode is 2-GByte in size, coincident with the "kuseg" of the user mode, so when in the kernel mode the processor treats reference to this segment just like user mode references, thus streamlining kernel access to user data. The kuseg 150 is used to hold user code and data, but the operating system often needs to reference this same code or data. The kseg0 area 152 is a 512-MByte kernel physical address space direct-mapped onto the first 512-MBytes of physical address space, and is cached but does not use the TLB 83; this segment is used for kernel executable code and some kernel data, and is represented by the area 143 of FIG. 18 in local memory 16. The kseg1 area 153 is also directly mapped into the first 512-MByte of physical address space, the same as kseg0, and is uncached and uses no TLB entries. Kseg1 differs from kseg0 only in that it is uncached. Kseg1 is used by the operating system for I/O registers, ROM code and disk buffers, and so corresponds to areas 147 and 149 of the physical map of FIG. 18. The kseg2 area 154 is a 1-GByte space which, like kuseg, uses TLB 83 entries to map virtual addresses to arbitrary physical ones, with or without caching. This kseg2 area differs from the kuseg area 150 only in that it is not accessible in the user mode, but instead only in the kernel mode. The operating system uses kseg2 for stacks and per-process data that must remap on context switches, for user page tables (memory map), and for some dynamically-allocated data areas. Kseg2 allows selective caching and mapping on a per page basis, rather than requiring an all-or-nothing approach.

The 32-bit virtual addresses generated in the registers 76 or PC 80 of the microprocessor chip and output on the bus 84 are represented in FIG. 20, where it is seen that bits 0-11 are the offset used unconditionally as the low-order 12-bits of the address on bus 42 of FIG. 3, while bits 12-31 are the VPN or virtual page number in which bits 29-31 select between kuseg, kseg0, kseg 1 and kseg2. The process identifier PID for the currently-executing process is stored in a register also accessible by the TLB. The 64-bit TLB entries are represented in FIG. 20 as well, where it is seen that the 20-bit VPN from the virtual address is compared to the 20-bit VPN field located in bits 44-63 of the 64-bit entry, while at the same time the PID is compared to bits 38-43; if a match is found in any of the sixty-four 64-bit TLB entries, the page frame number PFN at bits 12-31 of the matched entry is used as the output via busses 82 and 42 of FIG. 3 (assuming other criteria are met). Other one-bit values in a TLB entry include N, D, V and G. N is the non-cachable indicator, and if set the page is non-cachable and the processor directly accesses local memory or global memory instead of first accessing the cache 44 or 45. D is a write-protect bit, and if set means that the location is "dirty" and therefore writable, but if zero a write operation causes a trap. The V bit means valid if set, and allows the TLB entries to be cleared by merely resetting the valid bits; this V bit is used in the page-swapping arrangement of this system to indicate whether a page is in local or global memory. The G bit is to allow global accesses which ignore the PID match requirement for a valid TLB translation; in kseg2 this allows the kernel to access all mapped data without regard for PID.

The device controllers 30 cannot do DMA into local memory 16 directly, and so the global memory is used as a staging area for DMA type block transfers, typically from disk 148 or the like. The CPUs can perform operations directly at the controllers 30, to initiate or actually control operations by the controllers (i.e., programmed I/O), but the controllers 30 cannot do DMA except to global memory; the controllers 30 can become the VMEbus (bus 28) master and through the I/O processor 26 or 27 do reads or writes directly to global memory in the memory modules 14 and 15.

Page swapping between global and local memories (and disk) is initiated either by a page fault or by an aging process. A page fault occurs when a process is executing and attempts to execute from or access a page that is in global memory or on disk; the TLB 83 will show a miss and a trap will result, so low level trap code in the kernel will show the location of the page, and a routine will be entered to initiate a page swap. If the page needed is in global memory, a series of commands are sent to the DMA controller 74 to write the least-recently-used page from local memory to global memory and to read the needed page from global to local. If the page is on disk, commands and addresses (sectors) are written to the controller 30 from the CPU to go to disk and acquire the page, then the process which made the memory reference is suspended. When the disk controller has found the data and is ready to send it, an interrupt is signalled which will be used by the memory modules (not reaching the CPUs) to allow the disk controller to begin a DMA to global memory to write the page into global memory, and when finished the CPU is interrupted to begin a block transfer under control of DMA controller 74 to swap a least used page from local to global and read the needed page to local. Then, the original process is made runnable again, state is restored, and the original memory reference will again occur, finding the needed page in local memory. The other mechanism to initiate page swapping is an aging routine by which the operating system periodically goes through the pages in local memory marking them as to whether or not each page has been used recently, and those that have not are subject to be pushed out to global memory. A task switch does not itself initiate page swapping, but instead as the new task begins to produce page faults pages will be swapped as needed, and the candidates for swapping out are those not recently used.

If a memory reference is made and a TLB miss is shown, but the page table lookup resulting from the TLB miss exception shows the page is in local memory, then a TLB entry is made to show this page to be in local memory. That is, the process takes an exception when the TLB miss occurs, goes to the page tables (in the kernel data section), finds the table entry, writes to TLB, then the process is allowed to proceed. But if the memory reference shows a TLB miss, and the page tables show the corresponding physical address is in global memory (over 8M physical address), the TLB entry is made for this page, and when the process resumes it will find the page entry in the TLB as before; yet another exception is taken because the valid bit will be zero, indicating the page is physically not in local memory, so this time the exception will enter a routine to swap the page from global to local and validate the TLB entry, so execution can then proceed. In the third situation, if the page tables show address for the memory reference is on disk, not in local or global memory, then the system operates as indicated above, i.e., the process is put off the run queue and put in the sleep queue, a disk request is made, and when the disk has transferred the page to global memory and signalled a command-complete interrupt, then the page is swapped from global to local, and the TLB updated, then the process can execute again.

Private Memory

Although the memory modules 14 and 15 store the same data at the same locations, and all three CPUs 11, 12 and 13 have equal access to these memory modules, there is a small area of the memory assigned under software control as a private memory in each one of the memory modules. For example, as illustrated in FIG. 21, an area 155 of the map of the memory module locations is designated the private memory area, and is writable only when the CPUs issue a "private memory write" command on bus 59. The private memory area 155 is further divided between the three CPUs; only CPU-A can write to area 155a, CPU-B to area 155b, and CPU-C to area 155c. One of the control signals in bus 57 is set by the bus interface 56 to inform the memory modules 14 and 15 that the operation is a private write, and this is set in response to the address generated by the processor 40 from a Store instruction; bits of the address are detected by a decoder in the bus interface and used to generate the "private memory write" command. During this private write, all three CPUs present the same address on their bus 57 but different data on their bus 58 (the different data is some state unique to the CPU, for example). The memory modules perform a vote in vote circuits 100 on the addresses on the three busses 57, and select data from only one CPU. Part of the address field seen on bus 57 is used to select the data from the designated CPU. To allow the CPUs to vote some data, all three CPUs will do three private writes (there will be three writes on the busses 21, 22 and 23) of some state information unique to a CPU, into both memory modules 14 and 15. During each write, each CPU sends its unique data, but only one is accepted each time. So, the software sequence executed by all three CPUs is (1) Write (to location 155a), (2) Write (to location 155b), (3) Write (to location 155c). But data from only one CPU is actually written each time, and the data is not voted (because it is different and would show a fault if voted). Then, the CPUs can vote the data by having all three CPUs read all three of the locations 155a, 155b and 155c, and by software voting this data. This type of operation is used in diagnostics, for example, or in interrupts to vote the cause register data.

Fault-Tolerant Power Supply

Referring now to FIG. 22, the system of the preferred embodiment may use a fault-tolerant power supply which provides the capability for on-line replacement of failed power supply modules, as well as on-line replacement of CPU modules, memory modules, I/O processor modules, I/O controllers and disk modules as discussed above. In the circuit of FIG. 22, an a/c power line 160 is connected directly to a power distribution unit 161 that provides power line filtering, transient suppressors, and a circuit breaker to protect against short circuits. To protect against a/c power line failure, redundant battery packs 162 and 163 provide 4½ minutes of full system power so that orderly system shutdown can be accomplished. Only one of the two battery packs 162 or 163 is required to be operative to safely shut the system down.

The power subsystem has two identical AC to DC bulk power supplies 164 and 165 which exhibit high power factor and energize a pair of 36-volt DC distribution busses 166 and 167. The system can remain operational with one of the bulk power supplies 166 or 167 operational.

A number of DC-to-DC converters 168 connected to these 36-v busses 166 and 167 are used to individually power the CPU modules 11, 12 and 13, the memory modules 14 and 15, the I/O processors 26 and 27, and the I/O controllers 30. The bulk power supplies 164 and 165 also power the three system fans 169, and battery chargers for the battery packs 162 and 163. By having these separate DC-to-DC converters for each system component, failure of one converter does not result in system shutdown, but instead the system will continue under one of its failure recovery modes discussed above, and the failed power supply component can be replaced while the system is operating.

The power system can be shut down by either a manual switch (with standby and off functions) or under software control from a maintenance and diagnostic processor 170 which automatically defaults to the power-on state in the event of a maintenance and diagnostic power failure.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A computer system, comprising:
   a) a plurality of CPUs each executing the same instruction stream, each CPU having a clock to define machine cycles, the CPUs being clocked independently of one another by said clocks, said machine cycles providing execution cycles when instructions of said instruction stream execute or providing stall cycles when an instructions of said instruction stream do not execute;

b) each of the CPUs having a first counter to count execution cycles but not stall cycles, and having a second counter to count stall cycles;

c) each of said CPUs having a local memory requiring periodic refresh;

d) each of said CPUs having a separate refresh control responsive to a given count in said first counter of the CPU to initiate a refresh of said local memory of the CPU, and responsive to said second counter to perform a number of cycles of refresh of said local memory depending upon a selected count of the second counter, said refresh of said local memory occurring at the execution of an instruction in said instruction steam in all of said CPUs.

2. A system according to claim 1 wherein said CPUs are loosely synchronized by voting access to a common memory accessable by all said CPUs.

3. A system according to claim 1 wherein there are three said CPUs and wherein said CPUs access a duplicated common global memory.

4. A method of operating a computer system, comprising the steps of:

a) executing instructions of the same instruction stream in each one of a plurality of CPUs, the CPUs each having a separate clock and being clocked independently of one another by said separate clocks to provide machine cycles including execution cycles and stall cycles, the CPUs executing said execution cycles when said instructions are ready for execution or executing said stall cycles when said instructions are not ready for execution;

b) counting execution cycles but not stall cycles in each of the CPUs in a first counter, and counting stall cycles in each CPU in a second counter;

c) each of said CPUs accessing a separate local memory requiring periodic refresh;

d) and initiating refresh of said local memory separately for each CPU responsive to a given count in said first counter of each CPU and performing a number of cycles of refresh depending upon the count in said second counter of the CPU.

5. A method according to claim 4 wherein said step of initiating said refresh is done at execution of the same instruction in said instruction stream in each of said CPUs.

6. A method according to claim 4 wherein said CPUs are loosely synchronized by voting access to a common memory accessable by all said CPUs.

7. A method according to claim 4 wherein there are three said CPUs and wherein said CPUs access a duplicated common global memory.

8. A method of refreshing a memory accessed by a processor, comprising the steps of:

a) counting cycles during which said processor executes an instruction to provide a first count;

b) counting cycles during which said processor is stalled to provide a second count;

c) interrupting executing of instructions by said processor to refresh said memory when said first count reaches a selected value, said refresh of said memory upon said step of interrupting being for a number of refresh cycles determined by said second count, said number of refresh cycles being increased by one for each time the value of said second count exceeds the value of said first count.

9. A method according to claim 8 wherein said memory is a local memory and said processor also accesses a common memory, and including the step of accessing said common memory by another processor.

10. A method of operating a computer system having a plurality of processors which are executing the same instruction stream, each of said processors making the same accesses to a separate local memory for the same data items, comprising the steps of:

a) separately counting cycles during which each said processor executes an instruction to provide a first count for each processor;

b) separately counting cycles during which each said processor is stalled to provide a second count for each processor;

c) interrupting executing of instructions by each said processor to refresh said separate local memory for each said processor when said first count reaches a selected value, for a number of refresh cycles determined by said second count, said number of refresh cycles being increased by one for each time the value of said second count exceeds the value of said first count.

11. A method according to claim 10 including the step of accessing a common memory by each of said processors.

12. A method according to claim 11 wherein said step of accessing said common memory includes voting access requests from said processors to said common memory.

13. A method according to claim 11 including the step of clocking each of said processors separately by separate clock sources.

* * * * *